(12) United States Patent
Goyal et al.

(10) Patent No.: US 11,734,861 B2
(45) Date of Patent: Aug. 22, 2023

(54) 2D AND 3D FLOOR PLAN GENERATION

(71) Applicant: AWE Company Limited, Toronto (CA)

(72) Inventors: Shreya Goyal, Jaipur (IN); Chiranjoy Chattopadhyay, Jodhpur (IN); Naimul Mefraz Khan, Toronto (CA); Gaurav Bhatnagar, Jodhpur (IN); Srinivas Krishna, Toronto (CA); Laura Thomas, Toronto (CA); Daniel Chantal Mills, Toronto (CA)

(73) Assignee: AWE Company Limited, Toronto (CA)

( * ) Notice: Subject to any disclaimer, the term of this patent is extended or adjusted under 35 U.S.C. 154(b) by 13 days.

(21) Appl. No.: 17/482,111

(22) Filed: Sep. 22, 2021

(65) Prior Publication Data

US 2023/0106339 A1 Apr. 6, 2023

(51) Int. Cl.
*G06T 11/00* (2006.01)
*G06T 7/13* (2017.01)
(Continued)

(52) U.S. Cl.
CPC .............. *G06T 11/00* (2013.01); *G06F 18/23* (2023.01); *G06F 30/13* (2020.01); *G06T 3/0031* (2013.01); *G06T 7/13* (2017.01); *G06T 7/30* (2017.01); *G06T 7/50* (2017.01); *G06T 7/70* (2017.01); *G06T 7/97* (2017.01); *G06V 10/44* (2022.01);
(Continued)

(58) Field of Classification Search
CPC ......... G06T 11/003; G06T 2207/10004; G06T 2207/20081; G06T 2207/20084; G06T 2207/30248; G06T 2211/408; G06T 2211/424; G06T 7/13; G06T 7/136; G06T 7/40; G06T 7/50; G06T 7/70; G06N 20/00; G06N 5/022; G06N 7/01; G06V 20/56; G06V 2201/07
See application file for complete search history.

(56) References Cited

U.S. PATENT DOCUMENTS

2019/0035149 A1* 1/2019 Chen .................... G06V 40/166
2019/0050999 A1* 2/2019 Piat ........................... G06T 7/33
(Continued)

OTHER PUBLICATIONS

Ibraheem Alhashim and Peter Wonka, "High quality monocular depth estimation via transfer learning," arXiv preprint arXiv:1812.11941, 2018.
(Continued)

*Primary Examiner* — Ming Wu

(57) ABSTRACT

A floorplan modelling method and system. The floorplan modelling method includes receiving 2D images of each corner of an interior space from a camera, generating a corresponding camera position and camera orientation in a 3D coordinate system in the interior space for each 2D image, generating a depth map for each 2D image to estimate depth for each pixel, generating a corresponding edge map for each 2D image, and generating a 3D point cloud for each 2D image using the corresponding depth map and parameters of the camera. The floorplan modelling method includes transforming the 3D point clouds with the corresponding edge map into a 2D space in the 3D coordinate system of the camera, regularizing the 3D point clouds into 2D boundary lines, and generating a 2D plan of the interior space from the boundary lines.

28 Claims, 23 Drawing Sheets

(a) 2D Images   (b) Depth Maps   (c) Edge Maps   (d) 3D Reconstruction   (e) Partial Point Clouds

(51) Int. Cl.
| | |
|---|---|
| *G06T 7/00* | (2017.01) |
| *G06T 7/30* | (2017.01) |
| *G06T 7/50* | (2017.01) |
| *G06T 3/00* | (2006.01) |
| *G06F 30/13* | (2020.01) |
| *G06T 7/70* | (2017.01) |
| *G06V 10/44* | (2022.01) |
| *G06V 20/10* | (2022.01) |
| *G06F 18/23* | (2023.01) |

(52) U.S. Cl.
CPC .... *G06V 20/10* (2022.01); *G06T 2207/10016* (2013.01); *G06T 2207/10024* (2013.01); *G06T 2207/10028* (2013.01); *G06T 2207/20084* (2013.01); *G06T 2207/30244* (2013.01); *G06T 2210/04* (2013.01)

(56) References Cited

U.S. PATENT DOCUMENTS

2019/0197739 A1* 6/2019 Sinharoy .................. G06T 7/55
2019/0303648 A1* 10/2019 Zhai ...................... G06F 18/217

OTHER PUBLICATIONS

Chuhang Zou, Alex Colburn, Qi Shan, and Derek Hoiem, "Layoutnet: Reconstructing the 3d room layout from a single rgb image," CVPR, 2018, pp. 2051-2059.

Chenxi Liu, Alexander G Schwing, Kaustav Kundu, Raquel Urtasun, and Sanja Fidler, "Rent3d: Floor-plan priors for monocular layout estimation," CVPR, 2015, pp. 3413-3421.

Jian Zhang, Chen Kan, Alexander G Schwing, and Raquel Urtasun, "Estimating the 3d layout of indoor scenes and its clutter from depth sensors," ICCV, 2013, pp. 1273-1280.

Weidong Zhang, Wei Zhang, and Jason Gu, "Edge-semantic learning strategy for layout estimation in in-door environment," IEEE-T on cybernetics, 2019.

Sid Yingze Bao, Axel Furlan, Li Fei-Fei, and Silvio Savarese, "Understanding the 3d layout of a cluttered room from multiple images," WACV. IEEE, 2014, pp. 690-697.

Saumitro Dasgupta, Kuan Fang, Kevin Chen, and Silvio Savarese, "Delay: Robust spatial layout estimation for cluttered indoor scenes," CVPR, 2016, pp. 616-624.

Cheng Sun, Chi-Wei Hsiao, Min Sun, and Hwann-Tzong Chen, "Horizonnet: Learning room layout with 1d representation and pano stretch data augmentation," in CVPR, 2019, pp. 1047-1056.

Clara Fernandez-Labrador, Alejandro Perez-Yus, Gon-zalo Lopez-Nicolas, and Jose J Guerrero, "Layouts from panoramic images with geometry and deep learning," IEEE Robotics and Automation Letters, vol. 3, No. 4, pp. 3153-3160, 2018.

Chi-Wei Hsiao, Cheng Sun, Min Sun, and Hwann-Tzong Chen, "Flat2layout: Flat representation for estimating layout of general room types," arXiv preprint arXiv:1905.12571, 2019.

Jiu Xu, Bjorn Stenger, Tommi Kerala, and Tony Tung, "Pano2cad: Room layout from a single panorama image," WACV. IEEE, 2017, pp. 354-362.

Yinda Zhang, Shuran Song, Ping Tan, and Jianxiong Xiao, "Panocontext: A whole-room 3d context model for panoramic scene understanding," ECCV. Springer, 2014, pp. 668-686.

Axel Furlan, Stephen D Miller, Domenico G Sorrenti, Fei-Fei Li, and Silvio Savarese, "Free your camera: 3d indoor scene understanding from arbitrary camera motion.," BMVC, 2013.

Vincent Angladon, "Room layout estimation on mobile devices", Ph.D. thesis, University of Toulouse, 2018.

Ricardo Cabral and Yasutaka Furukawa, "Piecewise planar and compact floorplan reconstruction from images," CVPR. IEEE, 2014, pp. 628-635.

Cheng Lin, Changjian Li, Yasutaka Furukawa, and Wenping Wang, "Floorplan priors for joint camera pose and room ayout estimation," arXiv preprint arXiv:1812.06677, 2018.

"ARcore, fundamental concepts," https://developers.google.com/ar/discover/concepts, May 27, 2021.

"Sensopia. MagicPlan: Create a floor plan in just a few minutes," https://www.magicplan.app/magicplan, 2021.

"Occipital. The fastest way to measure (iOS application)," https://tapmeasure.io, 2021.

"Use the Measure app on your iPhone, iPad, or iPod touch," https://support.apple.com/en-us/HT208924, Feb. 22, 2021.

"AR Plan 3D Ruler—Camera to Plan, Floorplanner," https://arplan-3d.en.aptoide.com, May 4, 2021.

* cited by examiner

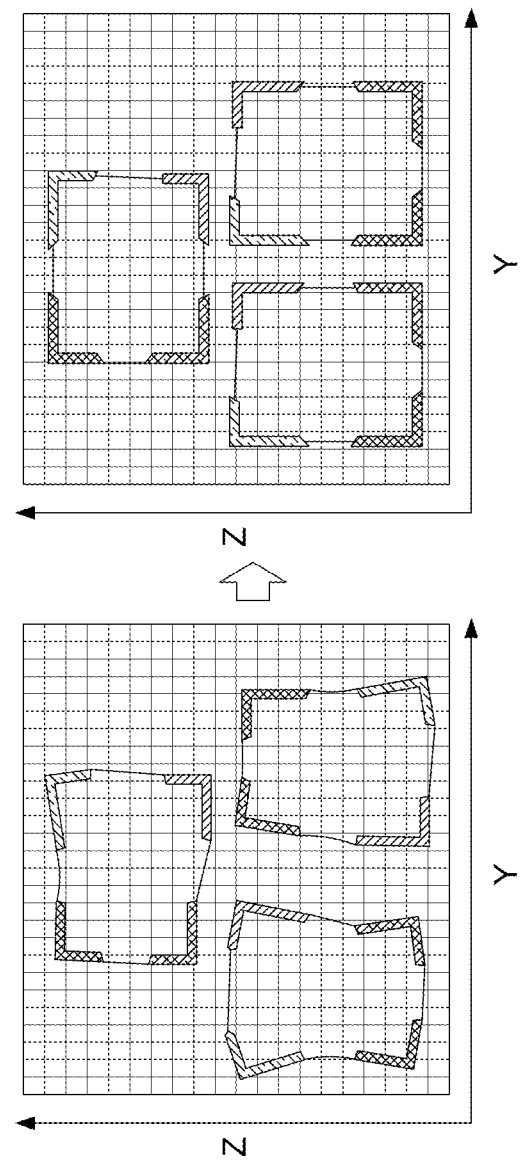
FIGURE 11C
FIGURE 11B
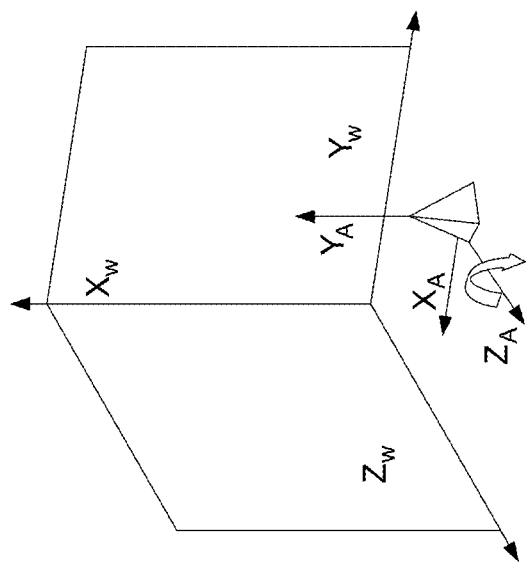
FIGURE 11A

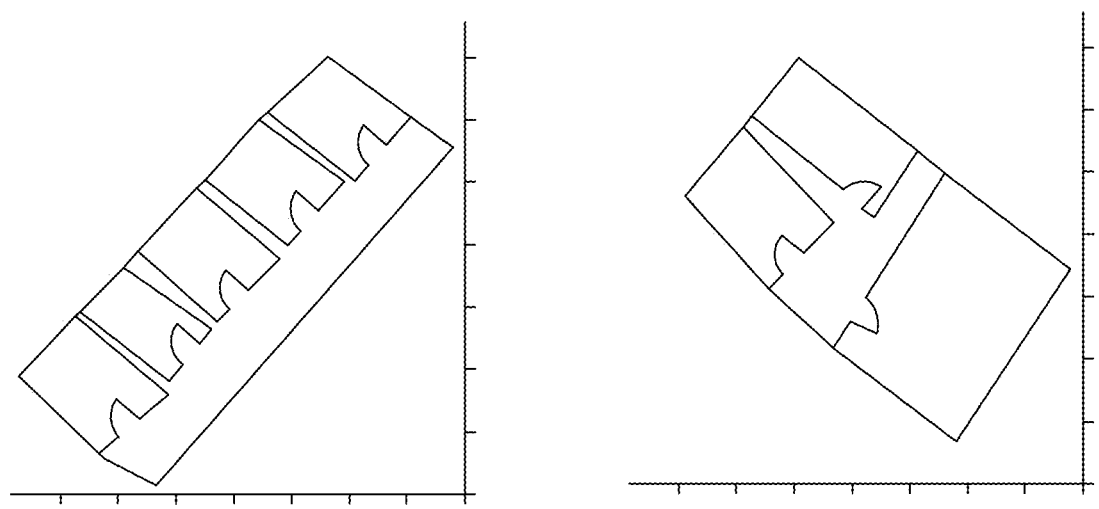
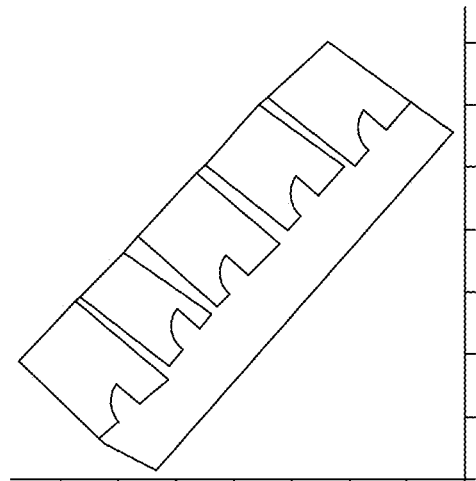
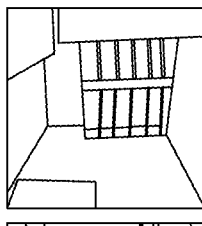
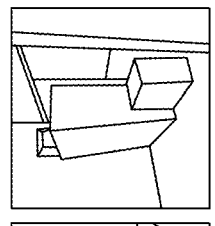
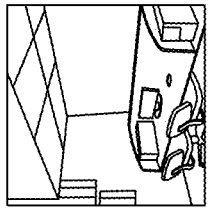
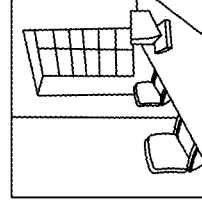
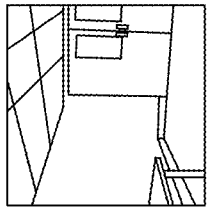
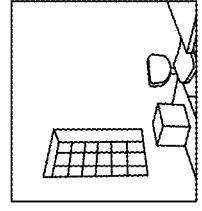
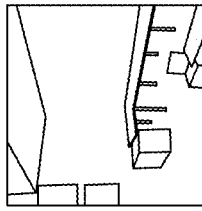
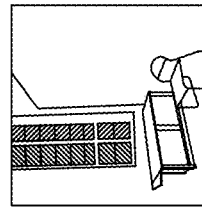
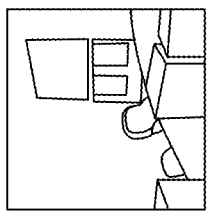
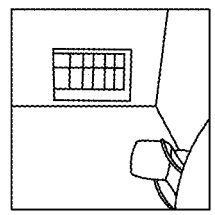
FIGURE 18A
FIGURE 18B Present System Magic plan Floor too uniform Scan a different part Google Measure Can't find anything. Aim device at a surface with more texture or color

2D AND 3D FLOOR PLAN GENERATION

TECHNICAL FIELD

Example embodiments relate to modelling floor layouts using two-dimensional images.

BACKGROUND

Generating Building Information Models (BIM) in two or three dimensions (2D/3D) from indoor views has many uses for real estate websites, indoor robot navigation, and augmented/virtual reality, among other applications. BIM often includes a global layout of an entire floor plan of the space, which typically involves multiple rooms in different arrangements. The most accurate way to create a floor plan is to manually measure the dimensions of each room and enter all of the measurements into Computer-Aided Design (CAD) software to generate a global layout. However, measuring and compiling such measurements manually is a tedious undertaking, especially if the floor has many rooms. Consequently, such manual methods generally require significant amounts of time to accomplish.

In order to speed up the process, some known applications use RGB-depth images and/or panorama images to solve this problem. For example, some applications reconstruct an indoor scene in 3D using RGB-D monocular images and estimate the layout using vanishing points and depth features. Another application generates room layout from pictures taken from multiple views and reconstructs them using structure from motion (SfM) techniques and region classification. In another application, layouts are estimated in a cluttered indoor scene by identifying label for a pixel from RGB images, using deep fully convolutional neural networks (FCNN), and refining the layout using geometrical techniques.

While such methods provide good accuracy, they require special hardware (such as a depth camera) or a particular photo capture mode (such as panorama) in order to be implemented. Accurate use of panorama images also requires the rooms to be clear, so that the captured images have little to no occlusion. Such requirements can be restrictive, thereby generally limiting their widespread adoption.

Additional difficulties of conventional modelling of interior space systems and methods may be appreciated in view of the Detailed Description, herein below.

SUMMARY

Example embodiments relate to a modelling system and method for modelling an interior space of a room. The modelling method can use standard 2D RGB images that can be taken with a camera on a smart phone. The 2D RGB images can be extracted from a video taken from the smart phone. The modelling system and modelling method can also be referred to as a floorplan modelling system and floorplan modelling method.

An example modelling method comprises: receiving two-dimensional (2D) images of corners of an interior space captured by a camera; generating, using a positioning module, a corresponding camera position and camera orientation in a three-dimensional (3D) coordinate system in the interior space for each 2D image; generating a corresponding depth map for each 2D image by using a depth module to estimate depth for each pixel in each 2D image; generating a corresponding edge map for each 2D image by using an edge module to identify whether each pixel in each 2D image is a wall or an edge; generating, using a reconstruction module, a 3D point cloud for each 2D image using the corresponding depth map and a focal length and center coordinates of the camera; transforming, using a transformation module, the 3D point clouds with the corresponding edge map into a 2D space in the 3D coordinate system from a perspective of the camera; regularizing, using a regularization module, the 3D point clouds in the 2D space into boundary lines; and generating a 2D plan of the interior space from the boundary lines.

In another example embodiment, the transforming comprises: mapping each 3D point cloud with the corresponding edge map to identify boundary pixels and projecting them in the 2D space to generate a partial point cloud for each 3D point cloud; and assembling the partial point clouds in the 3D coordinate system from the perspective of the camera using the corresponding camera positions and camera orientations.

In another example embodiment, the regularizing comprises: translating each partial point cloud into boundary corner lines using a clustering algorithm; and adjusting the boundary corner lines to be perpendicular boundary lines.

In another example embodiment, the regularizing further comprises: forming a polygon with the boundary lines; and adjusting the boundary lines such that adjacent lines are collinear.

In another example embodiment, the 2D images are RGB monocular images.

In another example embodiment, the 2D images are 2D images of each corner of the interior space, each 2D image corresponding with one corner of the interior space.

In another example embodiment, the positioning module comprises ARCore for generating the camera position and camera orientation for each 2D image.

In another example embodiment, the depth map for each 2D image is generated by an encoder-decoder architecture that extracts image features with a pre-trained DenseNet-169.

In another example embodiment, the edge map for each 2D image is generated by an encoder-decoder architecture that estimates layout with LayoutNet network.

In another example embodiment, the edge map for each 2D image is generated presuming a Manhattan world.

In another example embodiment, the method further includes identifying the focal length and center coordinates of the camera prior to generate the 3D point cloud for each 2D image.

In another example embodiment, coordinates for each pixel in each 3D point cloud is generated by:

$$Z = \frac{D_{u,v}}{S}$$

$$X = \frac{(u - C_x) * Z}{f}$$

$$Y = \frac{(v - C_y) * Z}{f}$$

wherein X, Y are coordinates corresponding to a real world,
Z is a depth coordinate,
$D_{u,v}$ is a depth value corresponding to the (u,v) pixel in the depth map,
S is a scaling factor of each corresponding 2D image,
f is the focal length of the camera, and
$C_x, C_y$ are the center coordinates of the camera.

In another example embodiment, the method further includes detecting, using an object detecting module, a presence and a door position of a door in one or more of the 2D images; and generating a door symbol in the door position in the 2D plan of the interior space.

In another example embodiment, the generating the door symbol in the door position is carried out using the following equations:

$$\text{Ratio}_D = \frac{dist(C_{BBI}, W_I)}{L_{WI}}$$
$$dist(C_{BBF}, W_{IF}) = L_{WF} * \text{Ratio}_D$$

wherein $C_{BBI}$ is a centroid of a bounding box of the door in the corresponding 2D image, $dist(C_{BBI})$ is a distance between $C_{BBI}$ and $W_I$ (wall), $L_{WI}$ is a distance between two corners of the walls in the corresponding 2D image, $\text{Ratio}_D$ is the ratio between $dist(C_{BBI})$ and $L_{WI}$, $L_{WF}$ is a distance between the two corners of the walls in the 2D plan of the interior space, $dist(C_{BBF}, W_{IF})$ is a distance between a centroid of the door symbol ($C_{BBF}$) and the wall ($W_{IF}$) in the 2D plan of the interior space.

In another example embodiment, the interior space is a floor with multiple rooms; wherein the generating of the boundary lines are for the multiple rooms; wherein the generating of the 2D plan includes generating respective 2D plans of the multiple rooms and arranging the respective 2D plans on the floor.

In another example embodiment, the method further comprises generating an outer boundary by finding a convex hull for all of the multiple 2D plans.

In another example embodiment, the method further comprises aligning all of the multiple 2D plans with the generated outer boundary.

In another example embodiment, the method is performed by at least one processor.

In another example embodiment, the method further comprises outputting the 2D plan on a display or on another device.

Another example embodiment is a modelling system for modelling an interior space of a room, the system comprising: at least one processor; and memory containing instructions which, when executed by the at least one processor, cause the processor to perform the modelling method of any of the above.

In another example embodiment, the system further comprises a camera configured to capture the 2D images of the interior space.

In another example embodiment, the camera is a monocular, RGB camera.

In another example embodiment, the system further comprises a local processor coupled to the camera; and a local memory containing instructions which, when executed by the local processor, causes the local processor to generate the camera position and camera orientation for each 2D image captured.

In another example embodiment, the camera, the at least one processor and the memory are part of a smart phone.

In another example embodiment, the system further comprises a display for displaying the 2D plan.

Another example embodiment is a non-transitory memory containing instructions which, when executed by at least one processor, cause the at least one processor to perform the modelling method of any of the above.

Another example embodiment is a computer program product by a machine learning training process, the computer program product comprising instructions stored in a non-transitory computer-readable medium which, when executed by at least one processor, causes the at least one processor to perform the modelling method of any of the above.

BRIEF DESCRIPTION OF THE DRAWINGS

Reference will now be made, by way of example, to the accompanying drawings which show example embodiments, and in which:

FIGS. 11A, 11B, and 11C depict the translation, assembling, and adjustment of boundary corner lines;

FIGS. 18A and 18B are illustrations of sets of captured images and their corresponding estimated layouts for the labs and office datasets;

Similar reference numerals may have been used in different figures to denote similar components.

DETAILED DESCRIPTION

Example embodiments relate to a modelling system and modelling method for generating layouts of rooms and floors from the real world.

An example of the modelling system and modelling method can be applied to enhance Building Information Models (BIM), making BIM easier to apply, for example, in the fields of extended reality, including augmented and virtual reality applications. Rather than relying on typical data heavy inputs, the system and method takes in standard 2D images of a space from a camera. The simple inputs are processed using the camera pose information and generate a reasonably accurate layout of the room and floor plan. By requiring far less user interaction and intervention, and requiring less computer processing power than other known modelling systems, generating a room or floor's layout becomes far simpler and cheaper to achieve. This simplification of the modelling process may help to allow building layouts to be used in more day-to-day functions. For example, additional augmenting information may readily be added to the generated layout so the generated layout can be used as an interactive virtual 2D map.

Figure 1A:
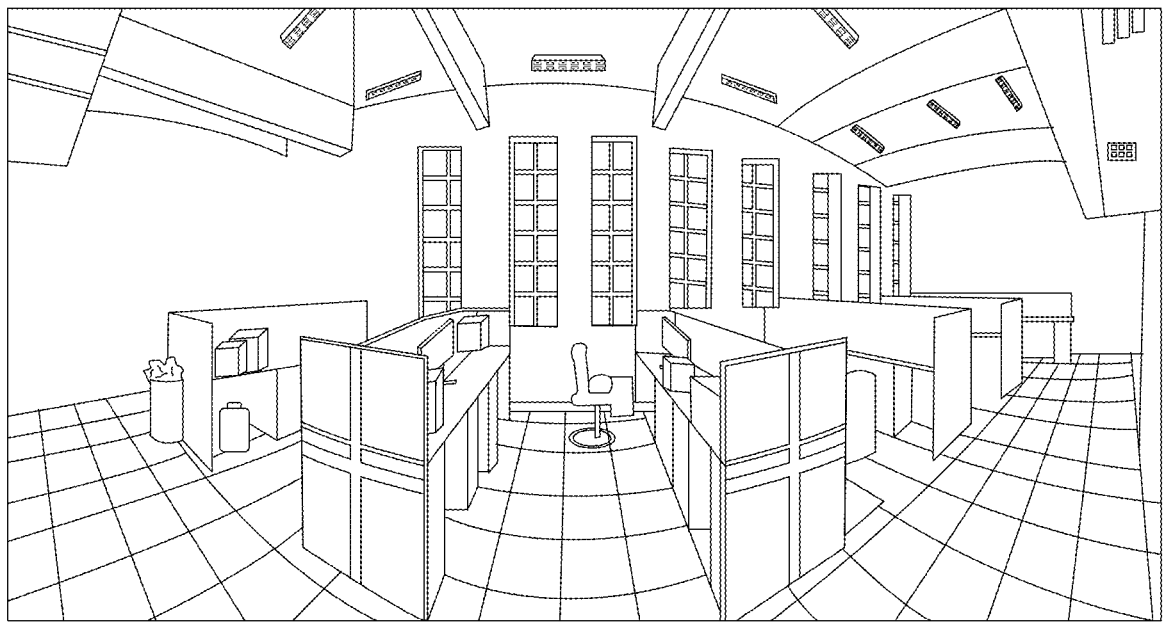
FIG. 1A shows a panoramic image of an example office space.
Figure 1B:
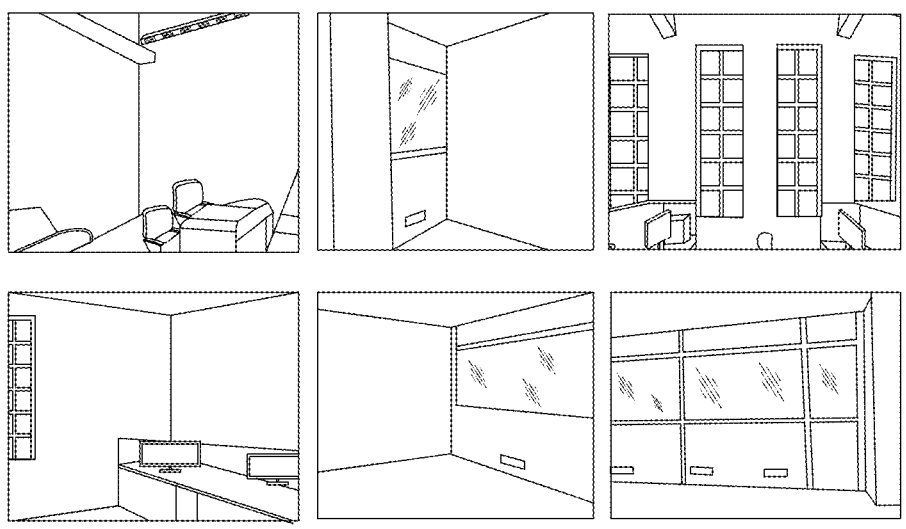
FIG. 1B are multiple 2D images of the office space of FIG. 1A.
Figure 2A:
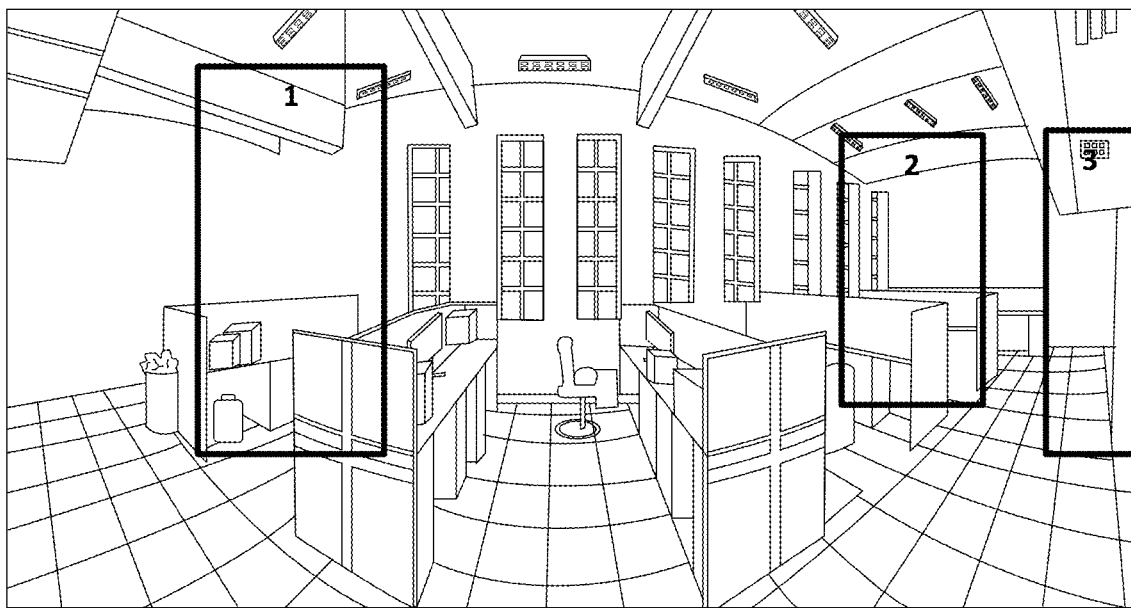
FIG. 2A shows the panoramic image of the office space of FIG. 1A with occluded corners highlighted.

As noted above, most existing systems and methods for 3D reconstruction of a room and floor plan typically require specific hardware such as a depth camera, a Kinect camera, or LiDAR. Although some methods exist for layout generation from monocular images, they rely on occlusion-free panoramic photos, which are very difficult to take in office or home spaces that are in use. An example of a typical panoramic image of a large office space is shown in FIG. 1A, while multiple 2D images for the same space is shown in FIG. 1B. It can be seen that the panoramic image of a vast space may have several occlusions, which may make their 3D reconstruction therefrom difficult and inaccurate. For example, as seen in FIG. 2A, most of the corners and other important edges of the office space are occluded in the panorama view because of the furniture and limitations of panorama capture. Boxes 1, 2, and 3 in FIG. 2A highlight the corners of the office that are occluded. As such, it is often impossible to capture the whole room in a single panoramic image without losing important information.

Figure 2B:
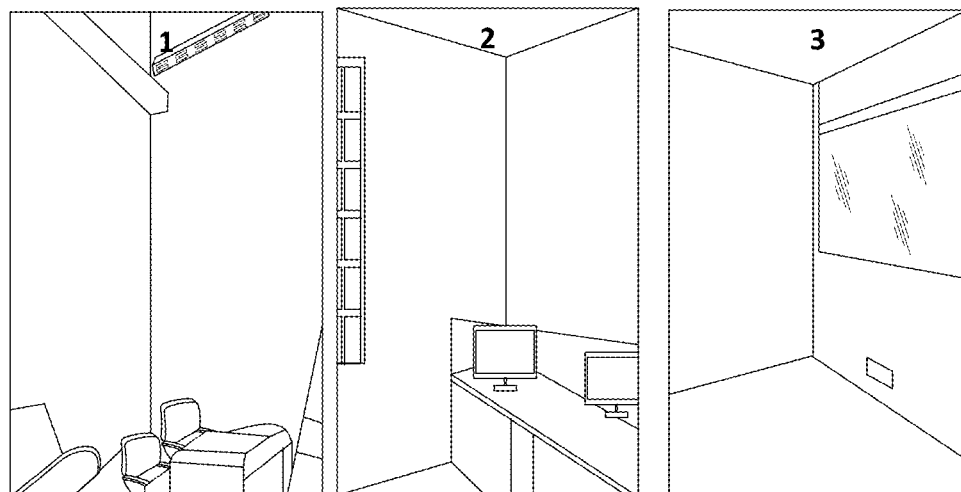
FIG. 2B are corresponding 2D images of the occluded corners highlighted in FIG. 2A.

However, FIG. 2B shows corresponding 2D images of boxes 1, 2, and 3, which have more information about their respective corners than their panoramic counterpart. In that regard, it is understood that images of important corners and edges tend to be easier to capture with multiple 2D images. Hence, generating the room's layout from their separate 2D images provides more accurate results than generation from a panoramic image, since separate 2D images encapsulate more information.

Figure 3:
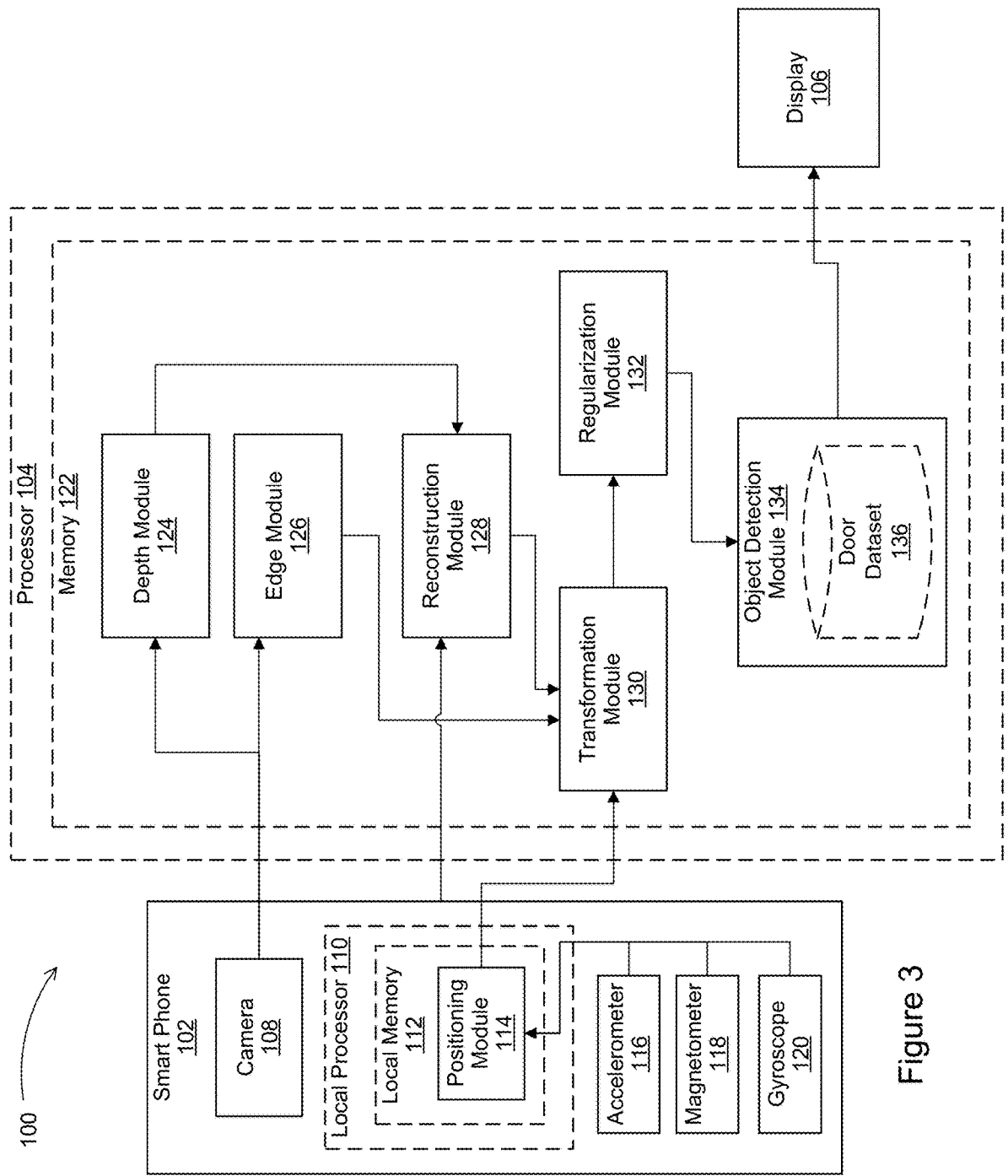
FIG. 3 illustrates a schematic block diagram of an example system for modelling an interior space of a room, in accordance with an example embodiment.
Figure 4A:
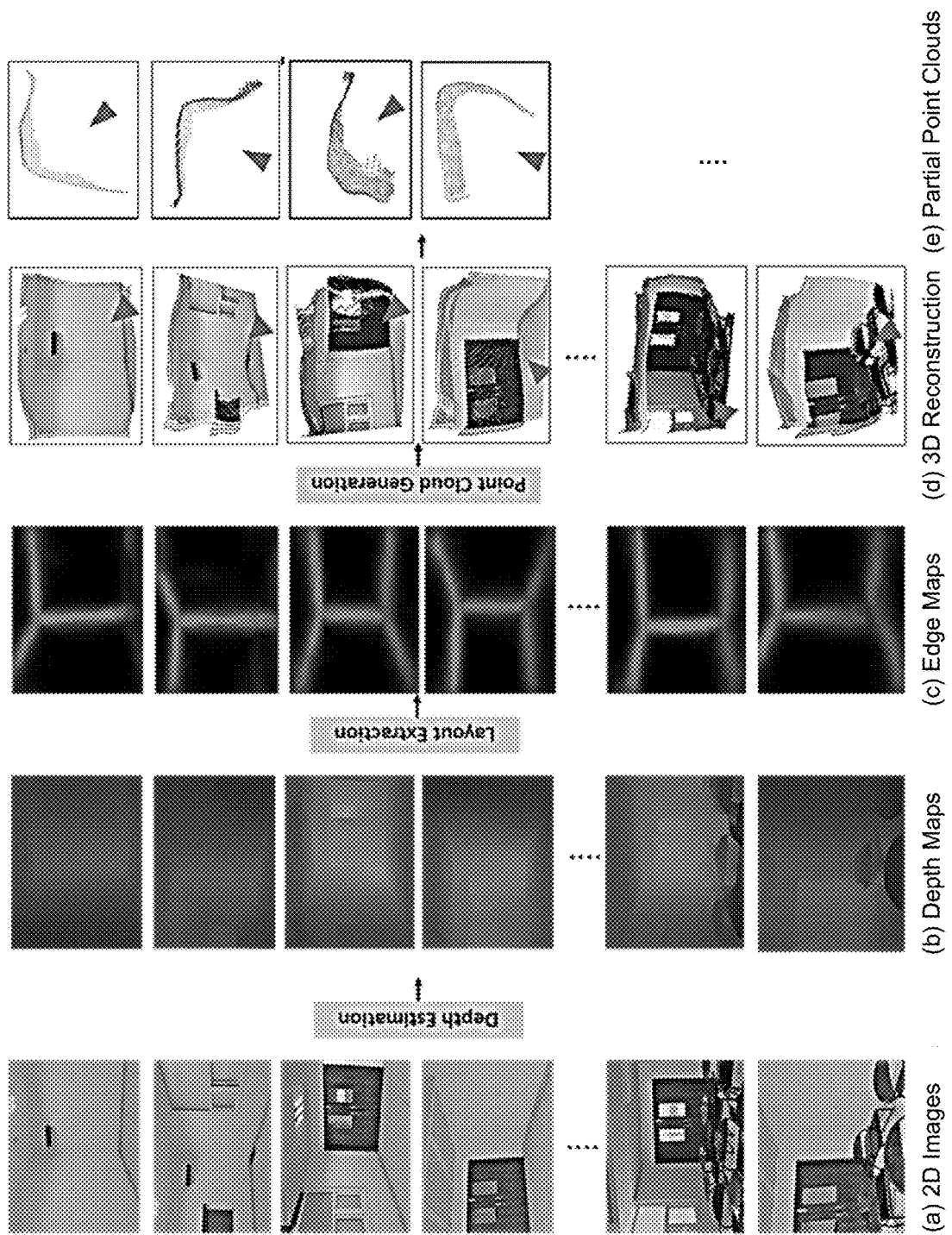
FIGS. 4A and 4B depict a step-by-step visual illustration of the use of the modelling system shown in FIG. 3.
Figure 4B:
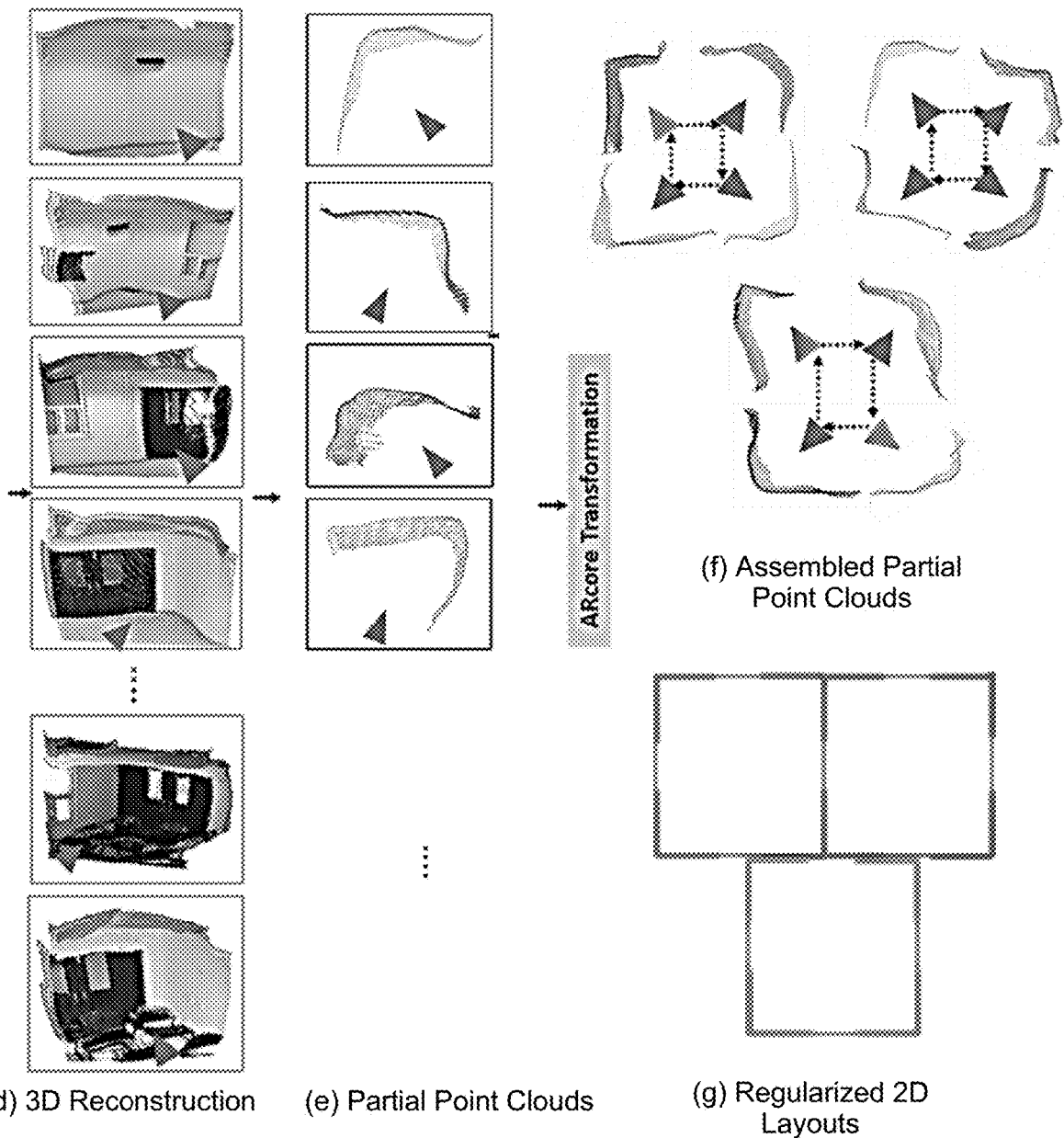

FIG. 3 illustrates a schematic block diagram of an example modelling system 100 for modelling an interior space of a room using multiple 2D images, in accordance with an example embodiment. As shown in FIG. 3, the modelling system 100 may include a smart phone 102, at least one processor 104, and one or more display devices 106. In some examples, the at least one processor 104 is on a separate device than the smart phone 102, such as a server or cloud server. In other examples, the at least one processor 104 is resident on the smart phone 102. FIGS. 4A and 4B depict a step-by-step visual illustration of the use of the modelling system 100 shown in FIG. 3.

Figure 5:
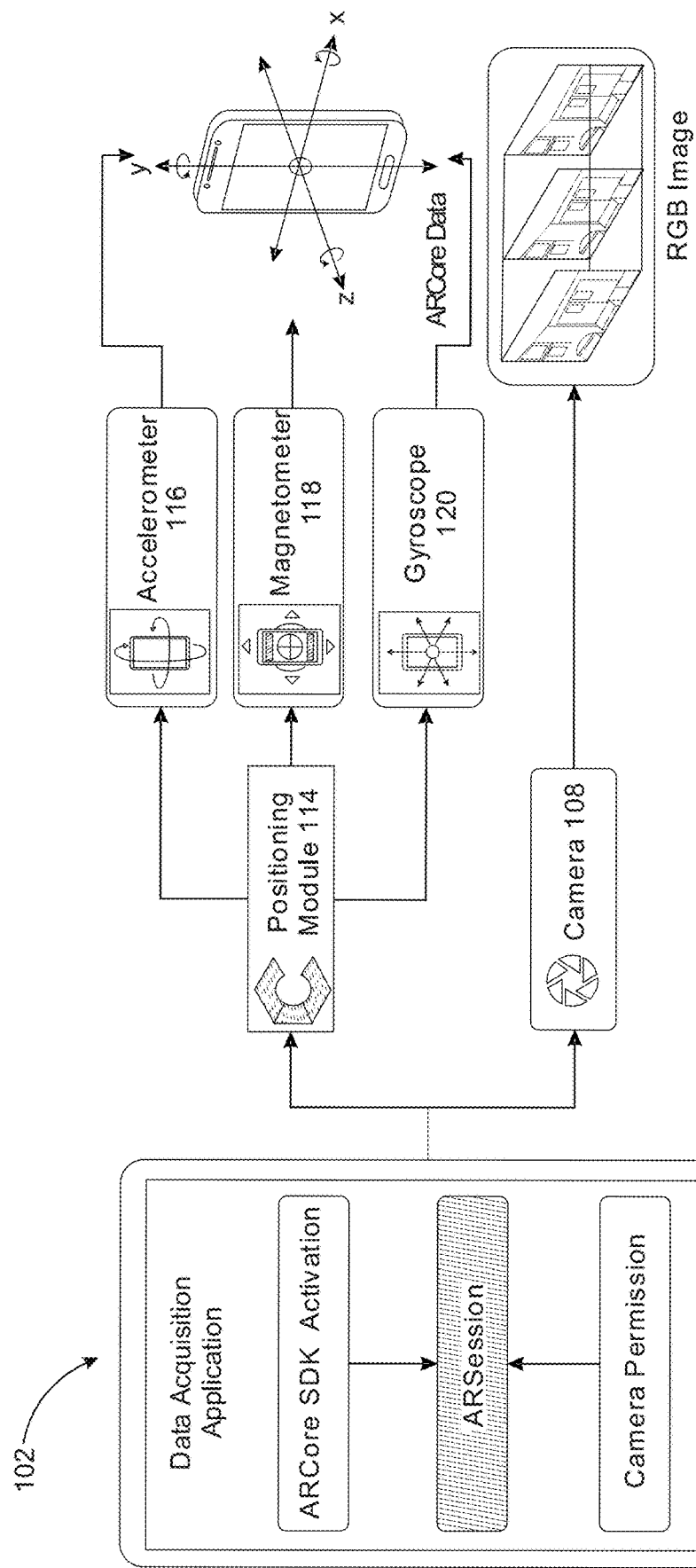
FIG. 5 is a schematic illustration of how a smart phone from the system of FIG. 3 collects data.

As best seen in FIGS. 3 and 5, the depicted smart phone 102 comprises a camera 108 and a local processor 110 coupled to the camera 108 with a local memory 112. The camera 108 may be a typical monocular camera configured to capture standard 2D RGB images. Example 2D RGB images are shown in FIG. 4A, under column (a). Notably, the 2D images each include at least one corner of its respective room. The local memory 112 comprises a positioning module 114, being instructions which, when executed by the local processor 110, causes the local processor 110 to generate the camera position and camera orientation (or pose) for each 2D image captured. To that end, the smart phone 102 is further shown having an accelerometer 116, a magnetometer 118, and a gyroscope 120, which are used by the local processor 110 to track the camera motion and determine the camera pose when capturing the 2D images.

In particular, positioning module 114 may involve ARCore, a mobile augmented reality library for pose estimation, which is readily available on most Android devices or smart phones. ARCore is a library by Google, which uses the phone's inertial measurement unit (IMU) sensor's (i.e. accelerometer 116, magnetometer 118, and gyroscope 120) data, along with image feature points for tracking the pose of the camera 108 utilizing a Simultaneous Localization and Mapping (SLAM) algorithm. ARCore can perform pose estimation in real-time. In that regard, to track the motion of the camera 108, an android application (i.e. the positioning module 114) using ARCore was developed in Unity 3D environment for capturing RGB images along with the real world location of smart phone 102. In the present case, the positioning module 114 generates or determines the position and orientation of the camera 108 in a three-dimensional coordinate system in the interior space for each 2D image. FIG. 5 is a schematic illustration of how smart phone 102 acquires images and collects data using ARCore in positioning module 114.

At least one processor 104 comprises, or is coupled to, a memory 122. Memory 122 contains instructions or a number of modules for execution by the at least one processor 104. In particular, memory 122 comprises a depth module 124, an edge module 126, a reconstruction module 128, a transformation module 130, a regularization module 132, and an object detection module 134.

The depth module 124 is configured to estimate depth for each pixel in each captured 2D image (from the camera 108) in order to generate a depth map for each 2D image. Traditionally, a device with a built-in depth camera, such as Google Tango or Microsoft Kinect, may be used for capturing point clouds directly from the scene. However, in the example modelling system 100, the input is one or more RGB images taken with a smart phone camera 108. Thus, depth perception is essential for estimating the correct dimensions of the targeted floor plan. For depth perception from RGB images, multiple methods are known to exploit feature matching techniques in multiple images of the same scene and to reconstruct a 3D model from that. However, such schemes typically require a trained user to capture the data to ensure correspondence across images.

Figure 6:
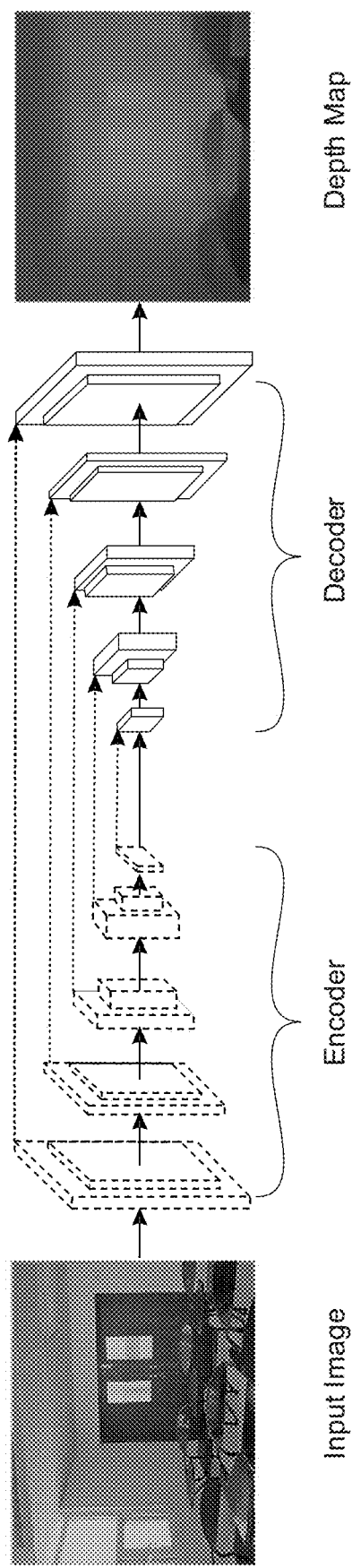
FIG. 6 is an illustration of how depth maps shown in FIG. 4A is generated.
Figure 7:
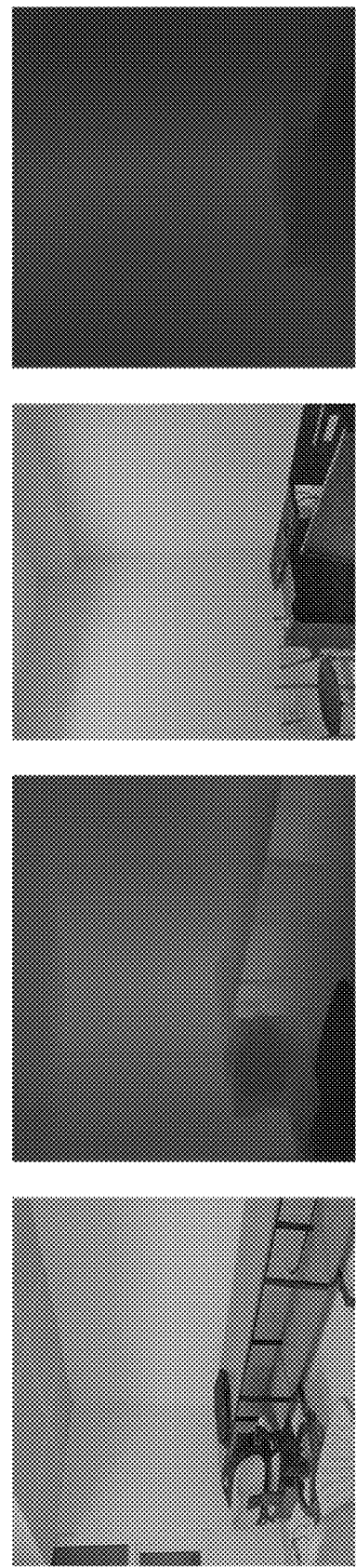
FIG. 7 shows example images with corresponding depth estimation models/maps.

Hence, the depth module 124 is configured to estimate depth from a single image using a pre-trained machine learning model. Depth for RGB images can be learned in a supervised manner from ground truth depth-maps, and a trained neural network can be used for estimating depth for new images. In the present embodiment, the depth module 124 is a modification of the depth estimation process set out in Alhashim, I., Wonka, P.: *High quality monocular depth estimation via transfer learning*, arX-ivpreprint arXiv: 1812.11941 (2018), incorporated herein by reference. In that regard, the depth module 124 comprises an encoder-decoder architecture for extracting image features with DenseNet-169, which results in high-resolution depth maps. The encoder used in the example modelling system 100 is a pre-trained truncated DenseNet-169. The decoder consists of basic blocks of convolutional layers, concatenated with successive 2× bilinear upsampling blocks, and two 3×3 convolutional layers, where the output filter is half the size of the input. FIG. 6 depicts an illustration of how the depth map is computed by the depth module 124 from a given image. FIG. 7 shows the results of the depth estimation model on example images. Example depth maps corresponding to the 2D RGB images from column (a) in FIG. 4A are shown under column (b) of FIG. 4A.

Figure 8:
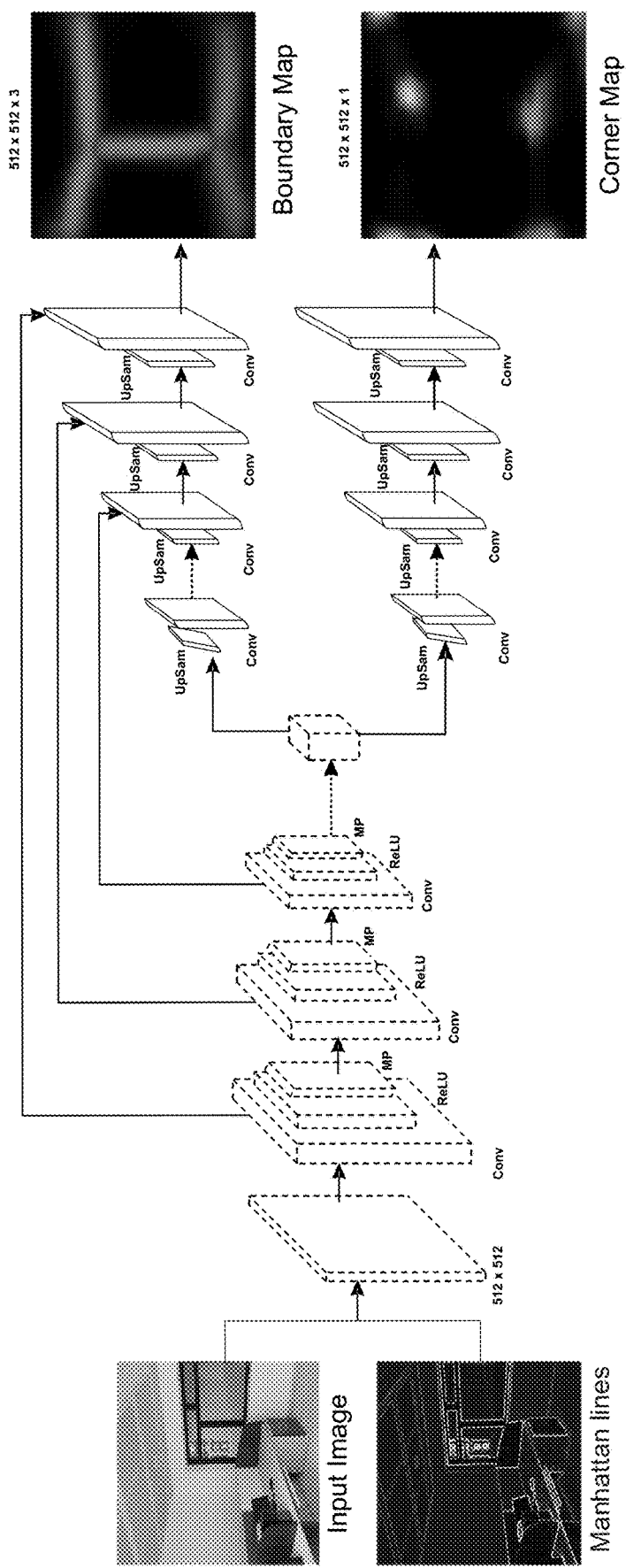
FIG. 8 illustrates example network architecture of how edge maps shown in FIG. 4A are generated with its respective inputs and outputs.

The edge module 126 is configured to identify whether each pixel in each 2D image (from the camera 108) is a wall or an edge, in order to generate an edge map for each 2D image. This classification or segmentation helps in the identification of the layout of the interior space of the room. In the present embodiment, the edge module 126 is a modification of the technique proposed in Zou, C., Colburn, A., Shan, Q., Hoiem, D.: *Layoutnet: Reconstructing the 3d room layout from a single rgb image*, CVPR, pp. 2051-2059 (2018), incorporated herein by reference. In that regard, the edge module 126 involves an encoder-decoder architecture that estimates/identifies a 2D image's edge/boundary with the LayoutNet network to generate an edge map for each 2D image. FIG. 8 illustrates an example network architecture of LayoutNet and its inputs and respective outputs.

The encoder consists of seven convolutional layers with a filter size of 3×3 and ReLU (Rectified Linear Unit) function and max-pooling layer follow each convolutional layer. The decoder structure contains two branches, one for predicting boundary edge maps and the other for corner map prediction. Both decoders have similar architecture, containing seven layers of nearest neighbor up-sampling operation, each followed by a convolution layer with a kernel size of 3×3 with the final layer being the Sigmoid layer. The corner map predictor decoder additionally has skip connections from the top branch for each convolution layer. Since the FOV (field of view) of the images is smaller, an additional predictor for predicting room type is added to improve corner prediction performance.

Figure 9:
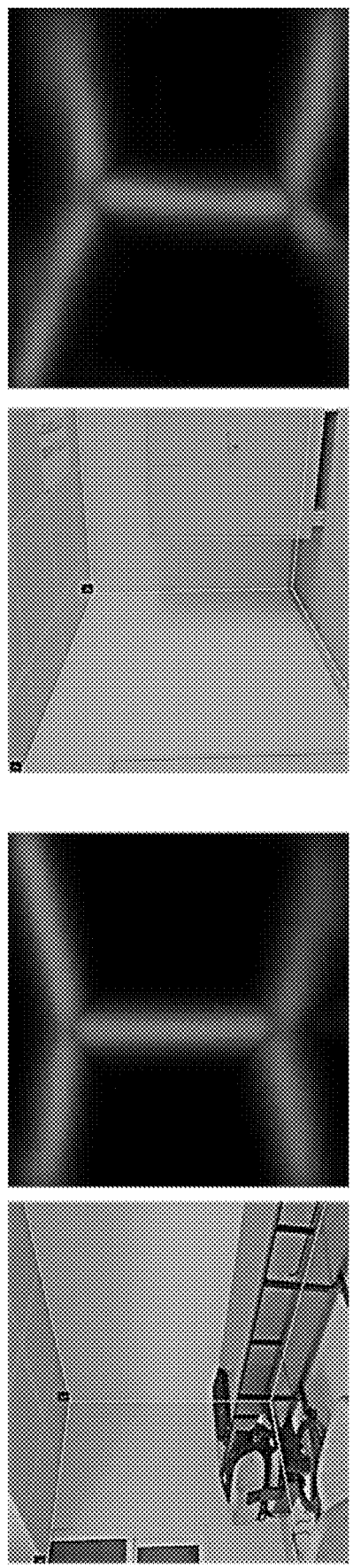
FIG. 9 shows example images with corresponding edge estimation models/maps.

The example modelling system 100 presumes Manhattan or weak Manhattan scenes (i.e. scenes built with walls and edges generally or dominantly aligned or parallel to the axes of a 3D Cartesian grid). Thus, the edge module 126 also takes Manhattan line segments as additional input to the RGB image of the scene, which provides other input features and improves the network's performance. FIG. 9 shows predicted edge maps for example input 2D images. Additional example edge maps that correspond to the 2D RGB images from column (a) in FIG. 4A are shown under column (c) in FIG. 4A. All the annotations for performance evaluation is done using the annotation tool proposed in Dutta, A., Zisserman, A.: *The VIA annotation software for images, audio and video*, Proceedings of the 27th ACM International Conference on Multimedia, MM '19. ACM, New York, N.Y., USA (2019), DOI 10.1145/3343031.3350535, URL: https://doi.org/10.1145/3343031.3350535, incorporated herein by reference. It is worth noting that the example 2D images have occluded corners and wall edges. However, the example modelling system 100 does not require manual addition of corners in order for the corners to be identified in the corresponding edge maps.

The reconstruction module 128 is coupled to receive data from the depth module 124 and from the smart phone 102. The reconstruction module 128 is configured to generate a 3D point cloud for each 2D image using the corresponding depth map from the depth module 124 and using intrinsic parameters of the camera 108, i.e. a focal length and center coordinates of the camera 108. The reconstruction module 128 may receive the focal length and center coordinates of the camera 108 for each 2D image from the local processor 110 of the smart phone 102.

In cases where depth cameras or specialized hardware are used to capture the images and/or point clouds, this 3D reconstruction would not be required. However, as the present modelling system uses 2D RGB images as inputs, 3D reconstruction of each scene image is required. To that end, every pixel of the RGB image is mapped to its corresponding depth map pixel (generated by the depth module 124) to create a 3D point cloud for each 2D image. In the present embodiment, each coordinate or pixel in each 3D point cloud is generated according to the equations:

$$Z = \frac{D_{u,v}}{S}$$
$$X = \frac{(u - C_x) * Z}{f}$$
$$Y = \frac{(v - C_y) * Z}{f}$$

X, Y are coordinates corresponding to the real world, Z is the depth coordinate, $D_{u,v}$ is the depth value corresponding to the (u, v) pixel in the depth map, S is the scaling factor of the corresponding scene, which is obtained empirically, comparing dimensions of real-world objects and point clouds. As noted above, f, $C_x$, $C_y$ are the intrinsic parameters of the camera, generated by calibration. f is the focal length of the camera 108, and $C_x$, $C_y$ are the center coordinates of the camera 108. Example 3D point clouds/reconstructions corresponding to the 2D RGB images from column (a) in FIG. 4A are shown under column (d) of FIG. 4A. The red triangle markers show the pose (camera orientation) of the camera 108 while capturing the 2D RGB image of the scene.

The transformation module 130 is coupled to receive data from the edge module 126, the reconstruction module 128, and the positioning module 114. The transformation module 130 is configured to transform the inputted 3D point clouds (from the reconstruction module 128) with their corresponding edge maps (from the edge module 126) into a 2D space in a 3D coordinate system (i.e. in the interior space of the real-world room) from a perspective of the camera 108 based on the pose of the camera 108 (from the positioning module 114).

In other words, the transformation module 130 is configured to take the generated 3D point clouds from the reconstruction module 128 and map them with the edge maps from the edge module 126 to identify the boundary pixels in the 3D point cloud, then project them into a 2D space to generate a partial point cloud for each 3D point cloud. As noted above, the edge maps are used to classify the pixels in the 3D point clouds to be either in wall or edge pixels, in order to identify the room's geometry. The resulting partial point clouds are scattered 3D points of the layout, see column (e) in FIG. 4A or 4B for example. The transformation module 130 is further configured to assemble the partial point clouds into the 3D coordinate system from the perspective of the camera 108 using the corresponding camera positions and camera orientations (pose information) from the positioning module 114. Example assembled partial point clouds, assembled according to the camera 108's pose information are shown under panel (f) of FIG. 4B. The positioning module 114 (such as, ARCore) is configured to extract the 3D position and trajectory of the camera 108, which is depicted by dotted arrows, as shown in panel (f) of FIG. 4B. The positioning module 114 returns rotational and translation coordinates for each 2D image taken from column (a) in FIG. 4A. All the captured 2D images are mapped to the local 3D coordinate system from the perspective of the camera 108. There is no requirement of rotating the coordinate system while considering the transformation.

Given the imprecise nature of point clouds, they must be regularized to reduce the error in the generated 2D plan layout's geometry. Thus, the transformation module 130 is coupled to the regularization module 132, which receives the partial point clouds from the transformation module 130. The regularization module 132 is configured to regularize the partial point clouds of each 2D image for every room in all of the rooms in a scene dataset. In the present case, regularization of each room is referred to as local regularization, while regularization of the entire floor is referred to as global regularization.

Thus, for a given room, the regularization module 132 is configured to translate each partial point cloud into boundary corner lines using a clustering algorithm and adjust the translated boundary corner lines to be perpendicular boundary lines. Alternately, a kmeans algorithm may be used. The regularization module 132 is further configured to form a polygon with the boundary lines and adjust the boundary lines such that adjacent lines are collinear (given the Manhattan world assumption).

In the present embodiment, the regularization module 132 achieves this local regularization with Algorithm 1.

---
Algorithm 1 Regularize point clouds (PC)
---

```
1:  ∀ R_j | R                           Δ R: Total number of rooms
2:  for i = 1 : n do                    Δ n: no of PC
3:      P_i = 2DPointClouds
4:      K = boundary (P_i)
5:      C(c_1, c_2, ..., c_k) =
        kmeans(P_i(K))                  Δ C: Clusters
6:      m_1, m_2, m_3 = mean(c_1), mean(c_2), mean(c_3)
7:      line_1 = line(m_1, m_2)
8:      line_2 = line(m_2, m_3)
9:      while angle(line_1, line_2) <= 90 do
10:         Rotate(line_2)
11:     RP_i = (line_1, line_2)         Δ RP_i: local PC
12:     TP_i = (Rot(θ_x, θ_y, θ_z ) * T r(t_x t_y))* R P_i
13:     FP = polygon(T P_1,
        T P_2, ..., T P_n)              Δ FP : Final PC
14:     for i = 1 : p do                Δ p: no of sides
        of polygon
15:         φ = angle(s_i, s_{i+1})     Δ s: sides of polygon
16:         if φ > 90 or φ < 90 then
17:             φ(s_i, s_{i+1}) = 0
```

Algorithm 1 regularizes the local point cloud of each partial scene image for every room ($R_1$) in all the room in a scene dataset (R). Here, $P_i$ is the point cloud of each i-th scene where n is the total number of point clouds. Boundary points for each $P_i$ is extracted in $P_i(K)$. Using the k-means algorithm, clusters of point set are made for k=3 on the Euclidean distance between them, where $m_1$, $m_2$, $m_3$ are the cluster means (line 6). Since we are presuming the Manhattan world for the scene, the lines joining means are re-adjusted to have a right angle (line 10). Each regularized partial point cloud ($RP_i$) is transformed ($TP_i$) using rotation angle $θ_x$, $θ_y$, $θ_z$, along each x, y, z axis and translation coordinates [$t_x$, $t_y$] returned by ARCore (line 12). For global regularization, using each transformed point cloud, polygon (FP is formed (line 13), with p number of sides (s). For each pair of sides, the angle between them (φ) is checked and if they are not perpendicular, they are made collinear (line 17) presuming the world to be Manhattan.

Figure 10C:
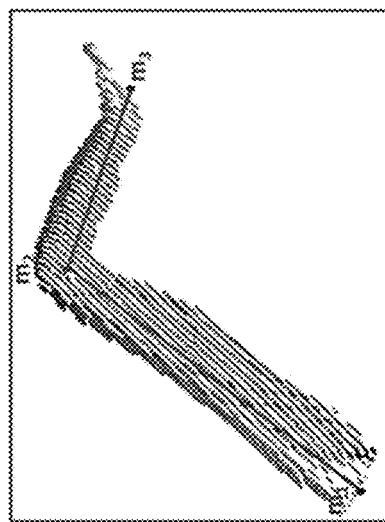
FIGS. 10A, 10B, and 10C depict an example partial indoor scene at different stages of 2D boundary line generation.
Figure 10B:
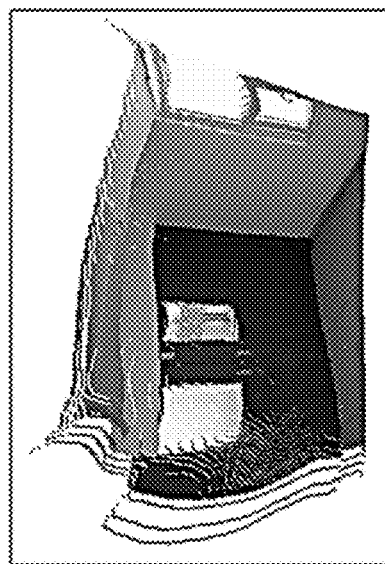
Figure 10A:

FIGS. 10A, 10B, and 10c depict an example partial indoor scene showing different stages of the 2D layout generation. FIG. 10A shows the 2D RGB image in consideration. FIG. 10B is its 3D reconstruction in the form of a 3D point cloud. FIG. 10C is the partial point cloud extracted from the 3D reconstructed point cloud in FIG. 10B by the transformation module 130. FIG. 10C shows the 2D projection of the partial point cloud, where $m_1$, $m_2$, $m_3$ are the means of three clusters extracted. FIG. 10C also shows the lines joining $m_1$, $m_2$, $m_3$, thereby regularizing the particular partial point cloud from the projected set of points into boundary corner lines.

FIGS. 11A, 11B, 11C depict the translation, assembling, and adjustment of the boundary corner lines. FIG. 11A shows the coordinate system in the real-world ($X_W$, $Y_W$, $Z_W$) and in ARCore with the smart phone 102 ($X_A$, $Y_A$, $Z_A$). ARCore transformations have to be rotated about the $Z_A$ axis to align the coordinate systems. Each set of boundary corner lines is adjusted to be perpendicular (forming perpendicular boundary lines), then rotated and translated with the transformation in view of the camera 108's pose information to form a polygon (see FIG. 11B) with boundary lines. As the present system presumes a Manhattan world, the angles between adjacent boundary lines are assessed. If they are found to be non-zero (or not collinear), they are adjusted to be collinear. FIG. 11C shows the regularized boundary lines forming a 2D plan (or 2D layout) for a set of rooms, which agrees with the real world dimensions. See also panel (g) in FIG. 4B for another example of regularized boundary lines forming a 2D plan layout for a set of rooms.

The regularization module 132 may be further configured to regularize, not just individual rooms, but multiple rooms arranged on a floor. To that end, the regularization may include generating an outer boundary by finding a convex hull for all of the (2D plan layouts of the) rooms and then aligning all of the rooms within the outer boundary generated.

In the present embodiment, the regularization module 132 achieves this global regularization with Algorithms 2 and 3. Algorithm 2 depicts the process of finding the outer boundary for of all the regularized layouts, and Algorithm 3 depicts their post-processing to align them along the outer boundary polygon.

---
Algorithm 2 Finding the points inside the boundary polygon.
---

```
1:  for i = 1 : n do
2:      L_i = (P_i, ∞)
3:      if intersection (L_i, C_{hull}) ==
        even then Δ C_{hull} : Convex
        hull forming boundary
4:          P_i ← P_{outside} : Δ P_{outside} :
            Pool of points outside the boundary
5:      else
6:          P_i ← P_{inside} : Δ P_{inside} :
            Pool of points inside the boundary
```

Algorithm 2 identifies the points for each room polygons inside the outer boundary polygon or on the outer boundary polygon so that individual room polygons may be aligned with the outer boundary. Points that are supposed to be on the outer boundary, but lie inside are identified using this algorithm. In Algorithm 2, line 2, a line $L_i$ is traced for each point $P_i$ to ∞, where line 3 checks if the intersection of line $L_i$ with the boundary of Convex hull $C_{hu}$n is an even number of times or an odd number of times. If the intersection has happened 0 or an even number of times, then the point is considered to be outside the outer boundary. Otherwise, the point is considered to be inside or on the outer boundary.

Figure 12A:
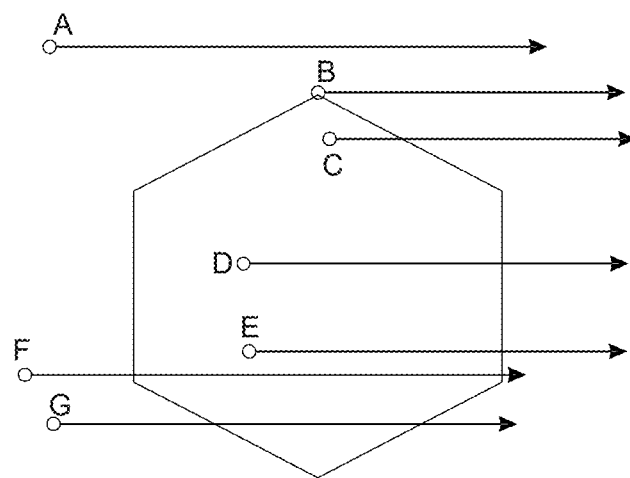
FIGS. 12A and 12B are illustrations of the intermediate stages of a regularization process.

FIG. 12A illustrates an example of such a process. For each room polygon, points closer to the outer boundary line are identified, and a line is drawn from that point to infinity. If the line intersects with the outer boundary polygon 0 or even times (such as points A, F, and G), then that point is outside the boundary polygon. Otherwise, the point is considered to be inside or on the polygon outer boundary (such as points B, C, D, and E). The purpose of using Algorithm 2 is to find the points which are lying inside the outer boundary and use them for further post-processing. If the point is identified to be inside the boundary polygon, then using Algorithm 3, they are aligned to the outer boundary line.

Algorithm 3 Aligning the points of each polygon to the boundary.

Figure 12B:
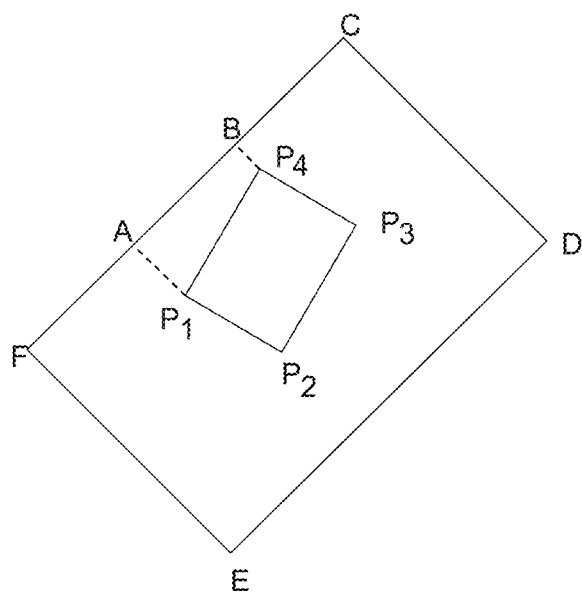

1: $\forall P_i \in$ polygon
2: $L_1 = P_i \perp CF$
3: $L_2 = CF$
4: find equation of each line
5: $y = Y_C + m_{L_1} * (x - X_C)$
6: $m_{L_1} = \dfrac{(Y_C - Y_F)}{(X_C - X_F)}$
7: $m_{L_2} = \dfrac{(Y_{P_i} - Y_A)}{(X_{P_i} - X_A)}$
8: $m_{L_1} * m_{L_2} = -1$   Perpendicularity condition
9: $X_A = X_{P_i} + \dfrac{Y_C - Y_A}{X_C - X_F} * (Y_{P_i} - Y_A)$   Substituting the known values to find unknowns
10: $Y_A = Y_C + m_{L_1} * (X_A - X_C)$
11: $X_{P_i} = X_A$   Replacing the points of polygon with respective points on boundary
12: $Y_{P_i} = Y_A$ Algorithm 3 shows the process of aligning the points of room polygons to the outer boundary polygon which are found to be inside. FIG. 12B shows the example of the polygon $P_1P_2P_3P_4$ which is required to be aligned with the outer boundary line CF. Points $P_1$ and $P_4$ are found to be inside the outer boundary polygon and needs to be aligned with line CF. Hence, they are replaced with points A and B respectively. Algorithm 3 finds the location of points A and B on line CF and replaces $P_1$ with A and $P_4$ with B by dropping a perpendicular line PA on CF and using properties of perpendicular line segments for identifying the coordinates for A and B. Algorithm 3, checks slopes of both line segments (Algorithm 3, line 6 and line 7) and checks the property of slopes of perpendicular line segments to identify $(X_A, Y_A)$ and $(X_B, Y_B)$, (Algorithm 3, line 8). Once identified, Algorithm 3 replaces both $P_1$ and $P_4$ with A and B (Algorithm 3, line 11 and line 12).

Figure 13D:
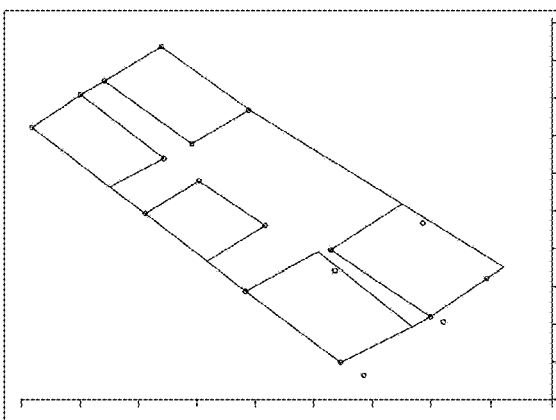
FIGS. 13A, 13B, 13C, and 13D illustrate step by step global regularization of the floor plan of an indoor scene.
Figure 13C:
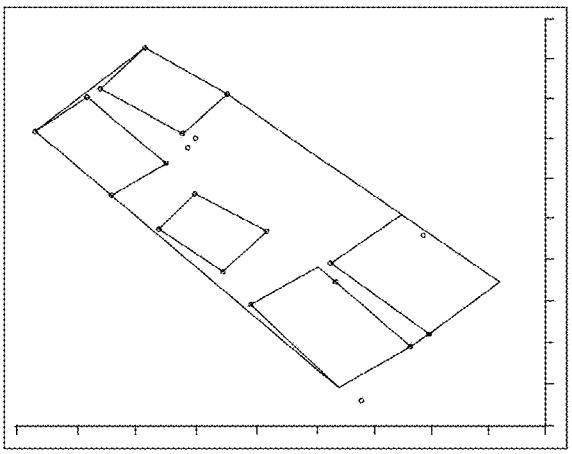
Figure 13B:
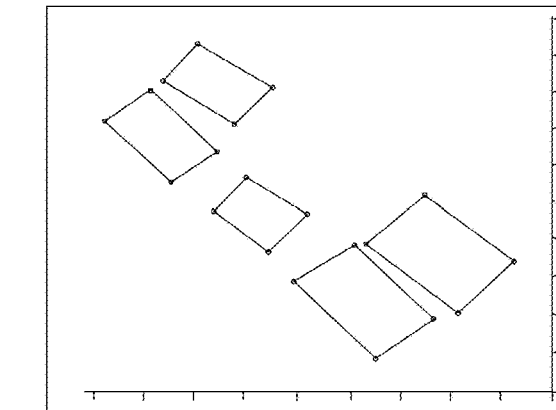
Figure 13A:
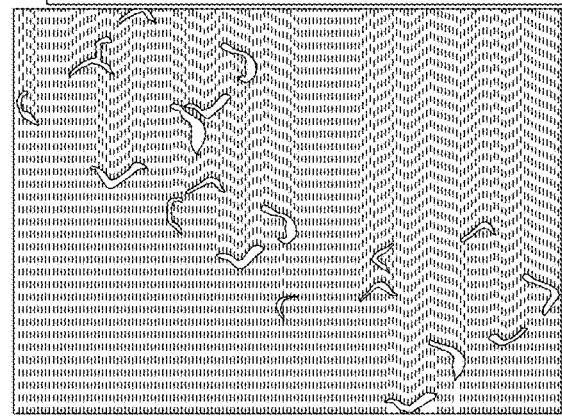

FIGS. 13A, 13B, 13C, and 13D depict the global regularization phases of generating a floor plan from its 2D projection layouts to the final 2D floor plan. FIG. 13A depicts the 2D layout of each room's partial point clouds on a floor after processing by the transformation module 130 and regularization module 132. FIG. 13B shows the regularized 2D plan layouts of each room, depicting the global relationship between them. FIG. 13C, the outer boundary for all of the rooms is generated by finding a convex hull for all the polygons and lines. FIG. 13D shows the further refined and post-processed floor plan from the 2D plan layouts. While the floor plans may be displayed and used in its present state, the modelling system 100 may optionally further include the object detection module 134.

The object detection module 134 may be coupled to receive data from the regularization module 132 and may be configured to detect objects in the 2D images (e.g. doors in the present embodiment), and mark the objects in the 2D floor plan generated by the regularization module 132.

Figure 14:
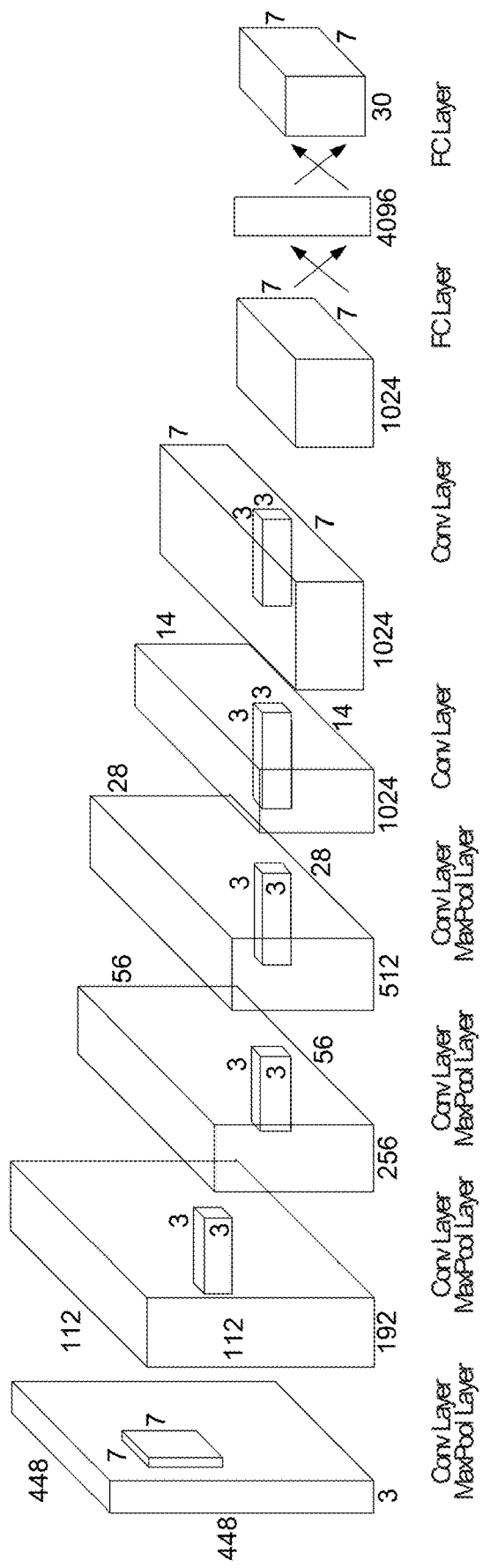
FIG. 14 is a schematic representation of the network architecture of YOLO for door detection.

Indoor object detection, such as the detection of doors, windows or other objects in indoor environments, from images or videos is a widely explored area. Known solutions include using object detection networks such as YOLO, Faster-RCNN, SSD, etc. However, a dataset containing doors or windows that is specific to indoor scenes is not commonly available. It is challenging to generate a dataset containing doors in an indoor environment with diversity to train/fine-tune existing networks. Hence, the example modelling system 100 uses a DoorDetect dataset 136 from Arduengo, M., Torras, C., Sentis, L.: *Robust and adaptive door operation with a mobile manipulator robot*, arXiv: 1902.09051v2 [cs.RO] 13 Sep. 2019, incorporated herein by reference. The example object detection module 134 relies on a trained YOLO object detection network on the DoorDetect dataset 136 to detect doors in the indoor scenes to complete the floor plans. YOLO's detection network has 24 convolutional layers followed by 2 fully connected layers (see FIG. 14, for example). Each alternating convolutional layer has a reduction of feature space from its preceding layer. The network is pre-trained with ImageNet-1000 class dataset. The DoorDetect dataset 134 contains 1213 images with annotated objects in an indoor environment. The door images contain various doors, such as entrance doors, cabinet doors, refrigerator doors, etc. The mAP on DoorDetect dataset for YOLO came out to be 45%.

Figure 15C:
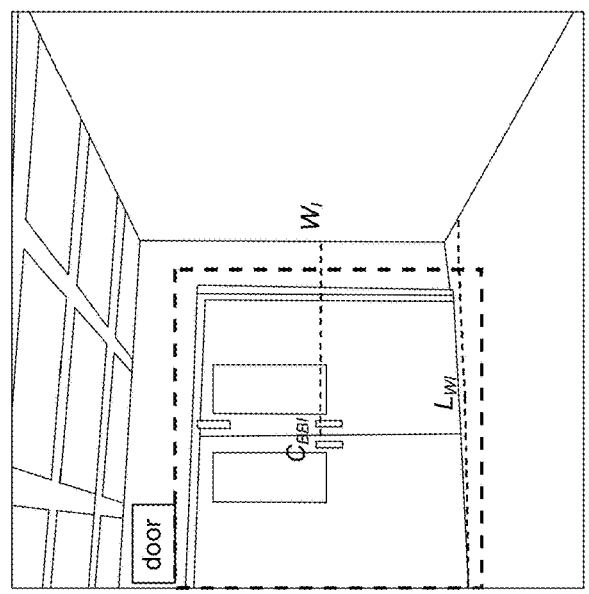
FIGS. 15A, 15B, and 15C are illustrations of the performance of the door detection and placement algorithm in a floor plan.
Figure 15B:
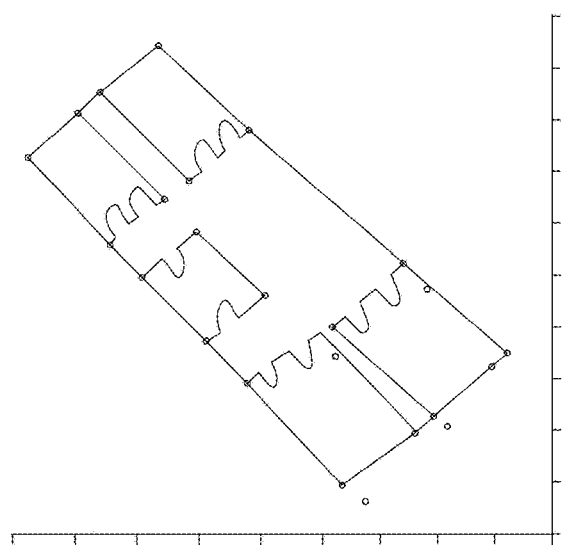
Figure 15A:
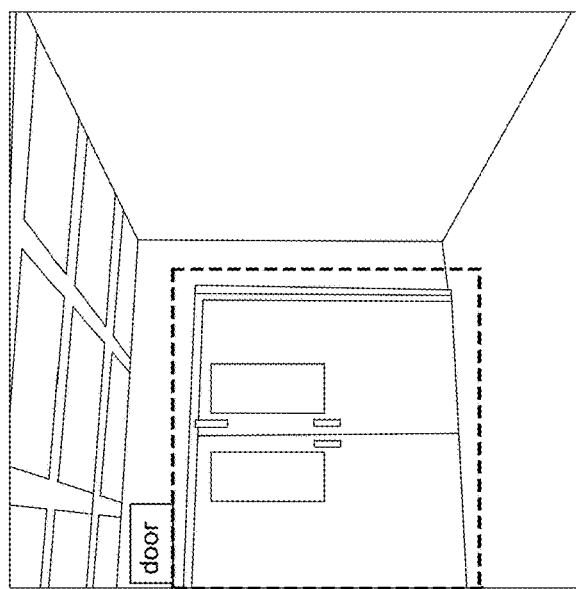

FIG. 15A shows a door that is detected by object detection module 134 in an example 2D image illustration. FIG. 15B shows the door placement (with a door symbol) in the floor plan generated by regularization module 132. FIG. 15C shows the parameters used for the door placement. The door placement is carried out by object detection module 134 using the following equations:

$$\text{Ratio}_D = \dfrac{dist(C_{BBI}, W_I)}{L_{WI}}$$

$$dist(C_{BBF}, W_{IF}) = L_{WF} * \text{Ratio}_D$$

where $C_{BBI}$ is a centroid of a bounding box of door detection (returned by door detection) in the corresponding 2D image, $dist(C_{BBI}, W_I)$ is a distance between $C_{BBI}$ and $W_I$ (wall), $L_{WI}$ is a distance between two corners of the walls in the corresponding 2D image, $Ratio_D$ is the ratio between them.

$Ratio_D$ is the ratio used for marking the doors in the generated floor plans with the reference of the corresponding 2D images of the scene. For each individual image with a door, the image is marked with a respective door symbol in its corresponding floor plan. In the present case, $L_{WF}$ is the distance between two corners of the walls in the corresponding 2D floor plan, dist($C_{BBF}$, $W_{IF}$) is the distance between the centroid of the door symbol ($C_{BBF}$) and wall ($W_{IF}$) in the corresponding 2D floor plan, which is an unknown entity and is identified using Ratio$_D$ to mark the doors in the floor plan. The axis of the door is kept perpendicular to the wall the door belongs to. Ratio$_D$ is the ratio which is scale invariant for the generated floor plan and will remain the same in the 2D image and its corresponding 2D layout.

Modelling system 100 may further include one or more display devices 106 for displaying the room and floor plan layouts generated by regularization module 132 or objection detection module 134. In some examples, the display device 106 may form part of smart phone 102, or the display device 106 may be separate from smart phone 102.

Figure 16:
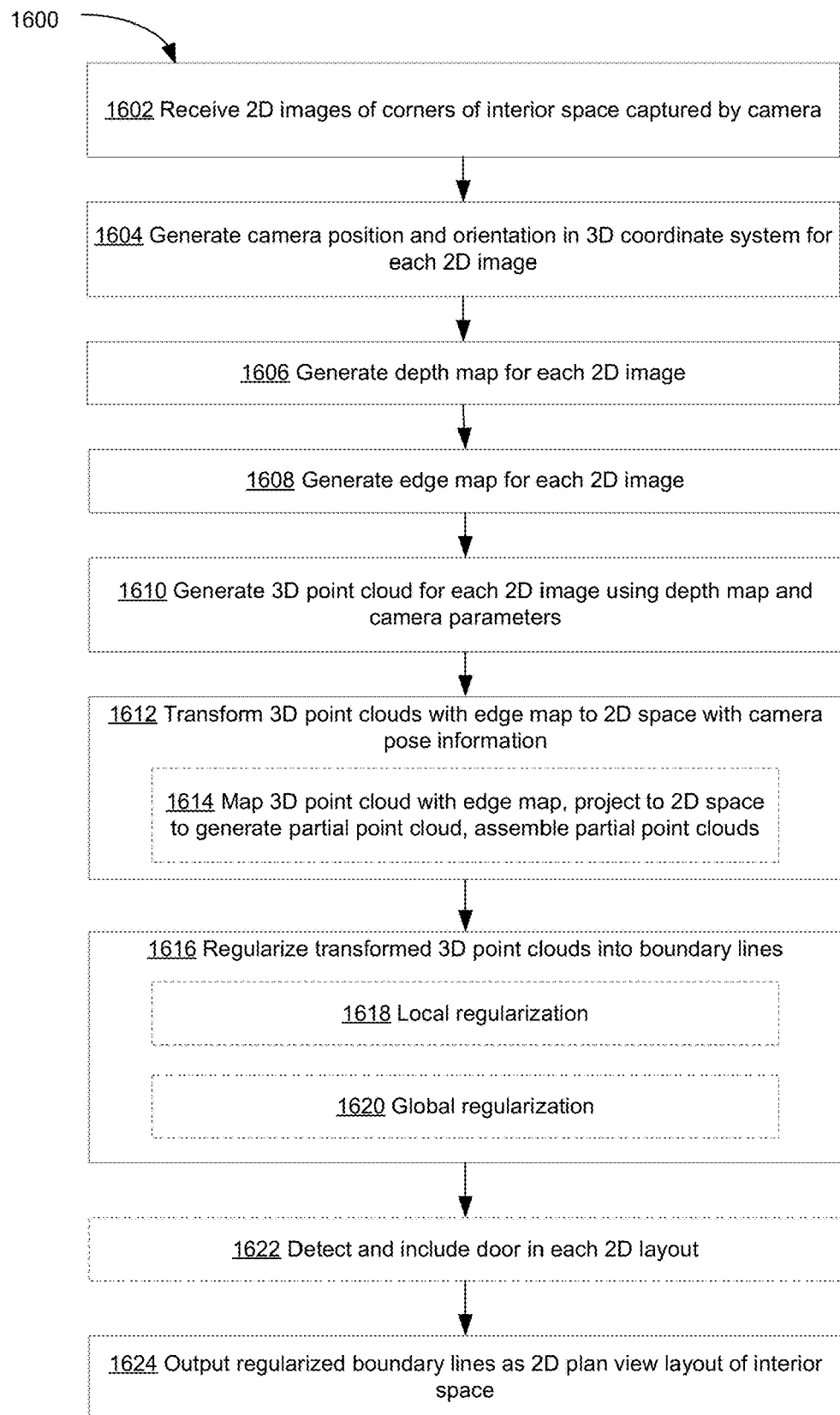
FIG. 16 is a flowchart illustrating the steps of a modelling method for modelling an interior space of a room, in accordance with an example embodiment.

Reference is now made to FIG. 16, which is a flowchart illustrating an example modelling method 1600 for modelling an interior space of a room using standard 2D RGB images as inputs. The modelling method 1600 may be performed using modelling system 100 as described above, or a different system with similar capabilities.

At 1602, the modelling method includes receiving 2D images of corners of the interior space, where the 2D images of the corners of the interior space were taken by a camera. In some cases, the camera may be part of a smart phone 102. In the present embodiment, the 2D images received are monocular RGB images of each corner of the interior space. For example, if the room is rectangular, the 2D images received may be four images, where each image is a picture of a different corner of the rectangular room. See FIG. 4A, column (a).

At 1604, the position and orientation from a perspective of the camera in a 3D coordinate system in the interior space for each 2D image may be generated, for example using a positioning module with ARCore. The position and orientation of the camera is collectively known as the pose of the camera.

At 1606, a depth map for each 2D image may be generated, for example by using a depth module, by estimating the depth of each pixel in each 2D image. The depth map for each 2D image may be generated with encoder-decoder architecture that extracts image features with a pre-trained DenseNet-169. See FIG. 4A, column (b).

At 1608, an edge map for each 2D image may be generated, for example by using an edge module, by identifying whether each pixel is a wall or an edge in each 2D image. The edge map for each 2D image may be generated with encoder-decoder architecture that estimates layout with LayoutNet network. The edge map for each 2D image may further be generated presuming a Manhattan world. See FIG. 4A, column (c).

At 1610, a 3D point cloud for each 2D image may be generated, for example with a reconstruction module, using the corresponding depth map generated at 1606 and the focal length and center coordinates of the camera. In that regard, coordinates for each pixel in each 3D point cloud may be generated by the following equations:

$$Z = \frac{D_{u,v}}{S}$$

$$X = \frac{(u - C_x) * Z}{f}$$

$$Y = \frac{(v - C_y) * Z}{f}$$

wherein X, Y are coordinates corresponding to the real world, Z is the depth coordinate, $D_{u,v}$ is the depth value corresponding to the (u, v) pixel in the depth map, S is the scaling factor of the corresponding scene, f is the focal length of the camera, and $C_x$, $C_y$ are the center coordinates of the camera. See FIG. 4A, column (d).

Optionally, prior to 1610, the camera may be calibrated to determine the intrinsic parameters of the camera, i.e. to determine the focal length and center coordinates of the camera for each of the 2D images.

At 1612, the 3D point clouds generated at 1610 may be transformed with the corresponding edge map (generated at 1608) into a 2D space in the 3D coordinate system from the perspective of the camera, for example using a transformation module. For example, in some embodiments, at 1614, each 3D point cloud may be mapped with the corresponding edge map (generated at 1608) to identify boundary pixels. The identified boundary pixels may then be projecting into a 2D space to generate a partial point cloud for each 3D point cloud. See FIG. 4A, column (e).

The partial point clouds may then be assembled in the 3D coordinate system from the perspective of the camera using the corresponding camera positions and orientations (that were generated at 1604). See FIG. 4B, panel (f).

At 1616, the transformed 3D point clouds in the 2D space may be regularized into boundary lines, for example using a regularization module. In that regard, the point clouds may undergo at least local regularization at 1618, and optionally global regularization at 1620.

At 1618, each partial point cloud may be translated into boundary corner lines using a clustering algorithm and adjusted to be perpendicular boundary lines (as the present modelling method is assuming a Manhattan world). See FIG. 10C. The perpendicular boundary lines may then be joined together to form a polygon with boundary lines (see FIG. 11B) and further adjusted such that adjacent lines are collinear. See FIG. 11C and panel (g) of FIG. 4B. If a floor has multiple rooms and a floor plan showing a global arrangement of the multiple rooms is desired, the modelling method 1600 may be performed for each of the multiple rooms.

If multiple rooms are involved, when their partial point clouds are assembled at 1612, the partial point clouds will be assembled in the 3D coordinate system from the perspective of the camera, notably, using the corresponding camera positions and orientations (that were generated at 1604). In other words, the pose information for each 2D image, and collectively for the images taken of each room, allows the various partial point clouds of each of the multiple rooms to be arranged relative to one another as is reflected in the real world. See FIG. 13A, for example.

At 1620 then, as described above, the regularized boundary lines for the multiple rooms would be outputted into the form of multiple 2D plan layouts arranged on the floor (see FIG. 13B). An outer boundary around all of the 2D layouts may be generated by finding a convex hull for all of the multiple 2D layouts (see FIG. 13B). All of the multiple 2D layouts may then be aligned with the generated outer boundary (see FIG. 13D).

Optionally, at 1622, the presence and placement of an object may be detected in one or more of the 2D images, for example with an object detection module. In the present embodiment, the object may be a door. Of course, other objects may be detected according to the present modelling method. Some examples of such objects include restrooms (e.g. toilets, showers, baths, etc.), stairwells, windows, or kitchens (e.g. fridge, stove, etc.). If a door is detected, a door symbol may be included in the corresponding position in the 2D layout of the room or floor generated at 1616.

The door placement may be carried out at 1622 using the following equations:

$$\text{Ratio}_D = \frac{dist(C_{BBI}, W_I)}{L_{WI}}$$

$$dist(C_{BBF}, W_{IF}) = L_{WF} * \text{Ratio}_D$$

wherein $C_{BBI}$ is a centroid of a bounding box of door detection (returned by door detection) in the corresponding 2D image, $dist(C_{BBI}, W_I)$ is a distance between $C_{BBI}$ and $W_I$ (wall), $L_{WI}$ is a distance between two corners of the walls in the corresponding 2D image, $\text{Ratio}_D$ is the ratio between them, $L_{WF}$ is a distance between two corners of walls in the corresponding 2D layout of the room, $dist(C_{BBF}, W_{IF})$ is a distance between centroid of the door symbol ($C_{BBF}$) and wall (WIT) in the corresponding 2D layout of the room.

At 1624, the regularized boundary lines, for example with door symbols, may be outputted to form the 2D layout of the room and/or floor. The 2D layout may be displayed on the smart phone, or on any other suitable display.

In some example experiments, two alternate hardware platforms were used: Google Pixel 2 XL and Samsung A50. Both of these mobile phones were utilized to deploy the data collection application (i.e. ARCore, to determine the camera position and camera orientation) and to capture the 2D images for all of the locations. For depth estimation accuracy analysis on the dataset, structural similarity, and peak SNR metrics are used. Also, metrics such as pixel error and corner error were used for layout estimation accuracy analysis on the dataset.

For evaluating the proposed layout estimation system's performance, area, and aspect ratio error metrics were used in quantitative analysis. Qualitative analysis was also done to depict the proposed system's robustness over existing Android and iOS based mobile applications. The performance of the present system has also been compared for the two hardware platforms mentioned above.

Figure 17:
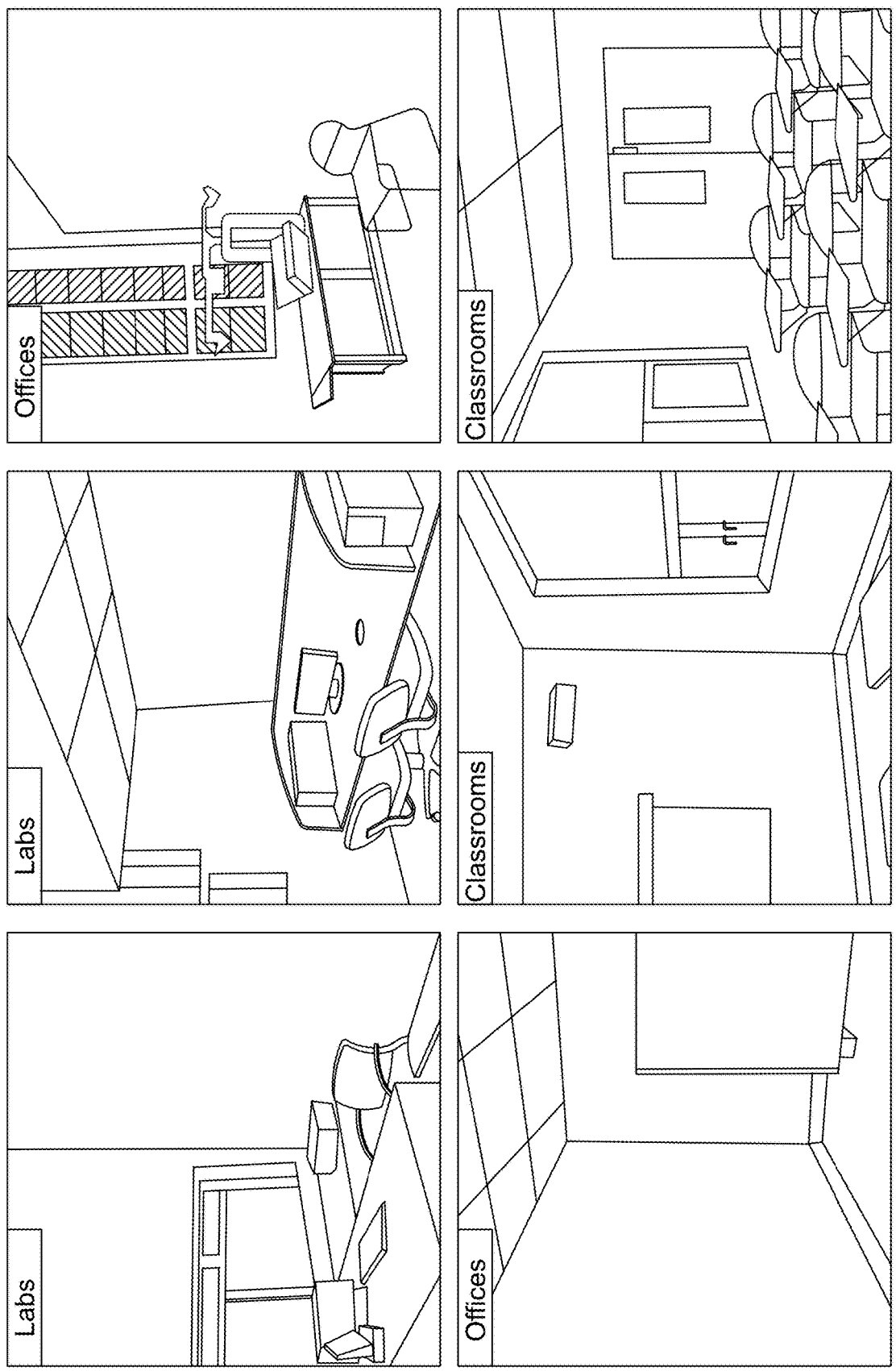
FIG. 17 are sample illustrations of images from the experimental datasets.

Experiments were performed with three sets of images. The first dataset is the right-wing of the ground floor of the Computer Science Department building in IIT Jodhpur, which are Classrooms. The second dataset is the left-wing of the same floor, which are Labs. The third dataset is the first floor of the same building which are Offices. FIG. 17 shows illustrations of sample images from the collected images from each category. It can be seen that the images in the dataset can contain zero to moderate or heavy occlusion with differently illuminated environments.

Depth estimation analysis was performed, as in Table 1.

TABLE 1

Performance analysis of depth estimation on our dataset

| Method | Classrooms | Labs | Offices |
|---|---|---|---|
| Structural similarity | 0.8433 | 0.7528 | 0.8174 |
| Peak SNR | 22.46 | 17.55 | 20.7808 |

Table 1 shows the performance analysis of the depth estimation step in the present method. Ground truth depth maps for all the images in our dataset were generated using a Kinect XBOX 360 depth camera. The performance evaluation is done on two metrics, Structural Similarity (SS) and peak SNR (PSNR) are defined as:

$$SS(x, y) = \frac{(2\mu_x\mu_y + C_1) * (2\sigma_{xy} + C_2)}{(\mu_x^2 + \mu_y^2 + C_2) * (\sigma_x^2 + \sigma_y^2 + C_2)} \quad (6)$$

$$PSNR = 20\log_{10} * (MAX_I) - 10\log_{10} * (MSE) \quad (7)$$

In Eq. 6, $\mu_x$ and $\mu_y$ are the mean intensity terms, while $\sigma_x$ and $\sigma_y$ are the standard deviations in the two image signals x and y, $C_1$ & $C_2$ are included to avoid instability when summations of mean intensities are close to zero. For PSNR, MSE is the mean square error between the reference image and generated image, $MAX_I$ is the maximum possible pixel value of the image. Lower value of SS and PSNR indicates low quality of generated images as compared to reference ground truth image. It can be seen that the images in the Labs dataset are performing worse than other dataset given its lowest value in terms of Structural Similarity, and PSNR because of the presence of variety of occlusion creating surfaces which creates irregular planes and limited field of view, making depth estimation a challenging task. As shown in FIG. 17, for the Labs scene images, the corners of partial scenes are highly occluded because of laboratory equipment, fixed sitting spaces and various other immovable heavy indoor objects.

Corner and edge estimation analysis was performed, as in Table 2.

TABLE 2

Corner and edge estimation analysis on our dataset

| Scene | Corner error (%) | Pixel error (%) |
|---|---|---|
| Classroom | 1.04 | 3.38 |
| Labs | 1.30 | 4.15 |
| Offices | 1.12 | 3.67 |

Table 2 shows the present system's performance on estimating the corners and edges of a room. The annotations for the layouts were generated using the tool proposed in the Dutta paper noted above. The evaluation w done on two parameters, pixel error P and corner error. Pixel error identifies the classification accuracy of each pixel with the estimated layout and ground truth and averaged over all the images in a dataset.

$$P = \frac{\sum_{n=1}^{i_n} \text{Similarity}(\text{Pixel}_E, \text{Pixel}_{GT})}{n} \quad (8)$$

$$\text{Similarity} = \begin{cases} \text{Pixel} \in \text{EdgeMap}, & \text{if Pixel} > 0 \\ \text{Pixel} \notin \text{EdgeMap}. & \text{Otherwise} \end{cases} \quad (9)$$

where, n is the total number of images in a dataset, $Pixel_E$ and $Pixel_{GT}$ are the pixels in estimated and ground truth images. Corner error C calculates the $L^2$ distance between the estimated corner and the ground truth corner of a room, normalized by image diagonal and averaged over all the images in a dataset. Here, $Corner_E$ and $Corner_{GT}$ are the estimated and ground truth corners.

$$C = \frac{\sum_{n=1}^{I_n} Dist_{L_2}(Corner_E, Corner_{GT})}{n} \quad (10)$$

It can be seen that Labs and Offices image dataset is more challenging than other datasets because of more occluded corners and edges with complex design of furniture and other experimental setups.

Comparative studies were made. FIGS. 18A and 18B show the generated layouts for two collected image datasets. The image dataset in FIG. 18A shows the resultant layout for the labs dataset and the image dataset in FIG. 18B shows the resultant layout for the offices dataset. The layout for the labs dataset also includes formation of a corridor in the final layout, where the left panels shows the input stream of RGB images for the respective scenes.

A comparative study was performed with applications such as Magic Plan, Tape Measure, Google Measure app, and AR Plan3D Ruler with the given ground truth measurements for each dataset. For every categories of images, the ground truth measurement was done by manually measuring each room's dimension in each dataset and evaluating the area and aspect ratio, respectively. Quantitative evaluation was done on mean absolute % error for area and aspect ratio for each dataset.

$$\text{Mean Absolute \% Error}(E) = \frac{1}{R}\sum_{i=1}^{R}\left|\frac{x_{GT} - x_i}{x_{GT}}\right| \quad (11)$$

where R is the total number of rooms in a dataset, $x_i$ is the area/aspect ratio of room $R_i$ and $X_{GT}$ is the ground truth area/aspect ratio for the same.

TABLE 3

Quantitative evaluation of the estimated layouts for different scenes(S) and methods(M)

| | Scene | | | | | |
|---|---|---|---|---|---|---|
| | Classrooms | | Offices | | Labs | |
| Methods | Area (E %) | Aspect Ratio (E %) | Area (E %) | Aspect Ratio (E %) | Area (E %) | Aspect Ratio (E %) |
| Present System | 3.12 | 2.21 | 3.25 | 2.65 | 5.59 | 3.07 |
| Magic Plan | 4.53 | 3.34 | 3.67 | 1.81 | 5.52 | 3.03 |
| Tape Measure | 3.55 | 3.58 | 8.26 | 1.71 | 6.93 | 1.21 |
| Google Measure app | 7.27 | 4.06 | 6.65 | 2.93 | 6.02 | 3.07 |
| AR Plan3D Ruler | 3.15 | 5.20 | 4.40 | 1.62 | 4.39 | 2.87 |

Table 3 depicts the quantitative evaluation for the estimated layout for different scene dataset and other applications of Android and iOS. Results show that the present modelling system and modelling method performs best in terms of mean error % (E) in area and aspect ratio for the Classroom dataset and area error for the Office dataset. For the lab dataset, ARplan3D performed best in terms of area error and Tape Measure performed best in aspect ratio error.

TABLE 4

Qualitative comparison of GRIHA and state-of-the-art.

| Method | User Interaction | Manual Intervention |
|---|---|---|
| Present System | 4 Nos. | Not required |
| Magic Plan | Continuous Scan | Add corners |
| Tape Measure | Continuous Scan | Add corners |
| Google Measure app | Continuous Scan | Add corners |
| AR Plan3D Ruler | Continuous Scan | Add corners, height |

Table 4 depicts the qualitative comparison between the present modelling system and modelling method and other applications. Here, the number of user interactions and the amount of manual intervention required were considered based on the comparison. In terms of user interaction, the present modelling system and modelling method can use only four interactions, i.e., images of four corners of a room, while other applications require a continuous scan and movement in the entire room. In terms of manual intervention, the present modelling system and modelling method does not necessarily require any "after clicking" of the pictures. Whereas the other applications require manually adding the corners and height of the room. The present modelling system and modelling method's only requirement is to "click" or take images, while other applications require time and manual calibration to understand the environment and features. Due to this continuous scanning and higher level of manual intervention, techniques like Magic Plan yield more accurate results than the present modelling modelling system and modelling method. However, in the other existing applications, if some object occludes the corner, the user must to add the corner themselves. A slight user error can heavily affect the accuracy of the layout. The accuracy of the existing applications also suffers in limited salient features in different scene frames while scanning.

Figure 19C:
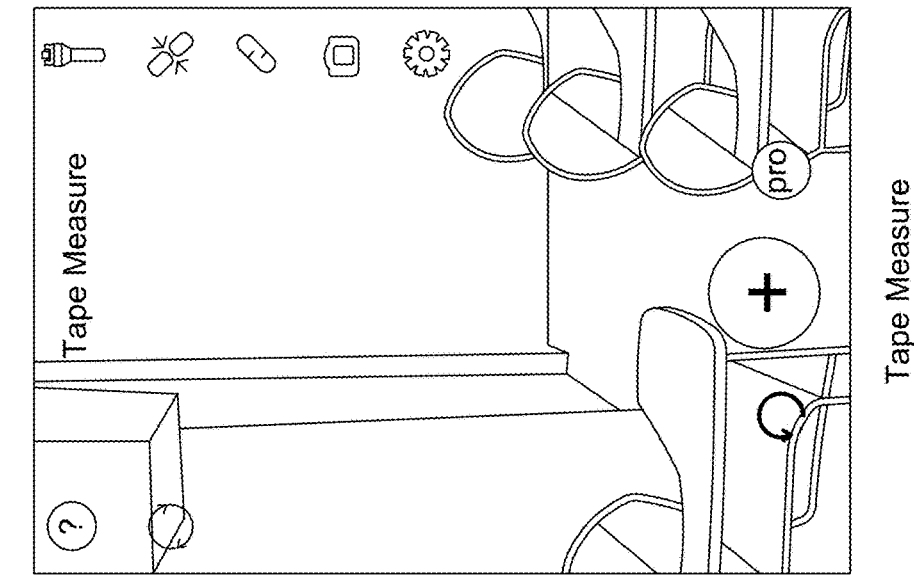
FIGS. 19A, 19B, and 19C are illustrations of Graphical User Interfaces (GUI) for three different layout estimation applications.
Figure 19B:
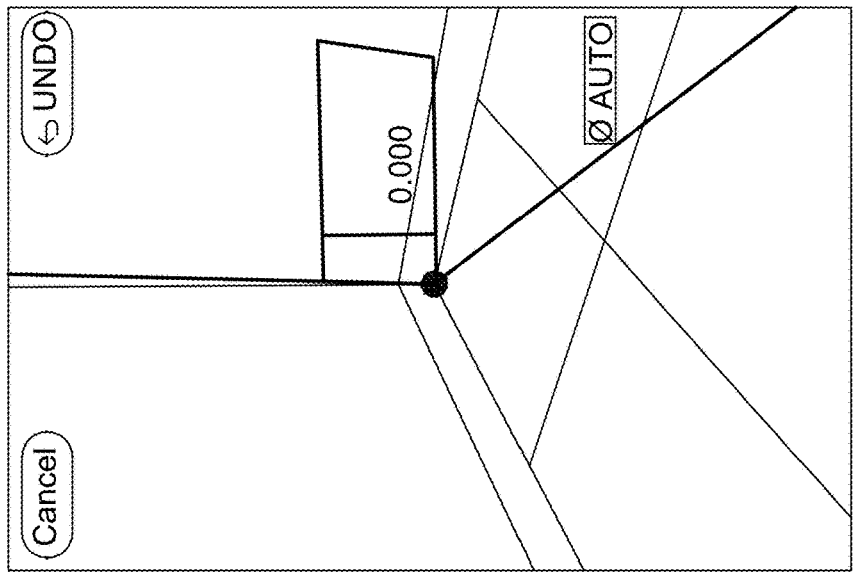
Figure 19A:
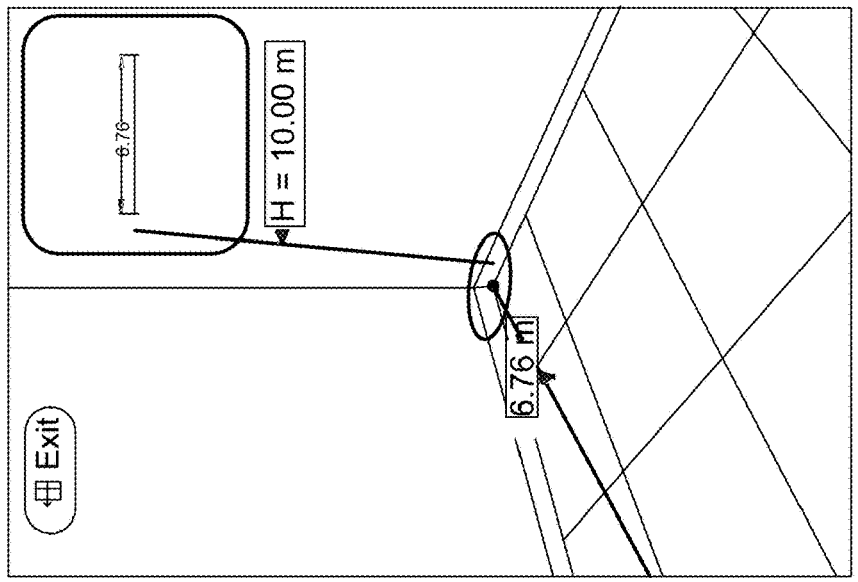

Robustness analysis was performed. FIGS. 19A, 19B, and 19C show illustrations of three other publicly available mobile applications while collecting the dataset for evaluation. FIG. 19A is a GUI for ARplan 3D Ruler, FIG. 19B is a GUI for Magic Plan, and FIG. 19C is a GUI for Tape Measure. There is a lot of manual interruption that requires layout estimation using these applications. For example, for ARplan 3D and Magic Plan, the rooms' corners have to be added manually, which is a very error-prone process. The person holding the mobile device has to be cautious and accurate while adding the corners. Otherwise, there will be an error in the measurement of the edges of the room. Also, FIG. 19C shows that if the edges or corners of the room are occluded by furniture or other room fixtures, measuring the edges with these applications is impossible since the wall edges are invisible and have to be scanned through the furniture only.

However, in the present modelling system and modelling method, these issues have been addressed making the present modelling system and method more robust than the other existing mobile applications. The present modelling system and modelling method do not require any manual interruption. Hence, the possibility of introducing manual error is ruled out. Also, the present modelling system and modelling method does not require the mobile device to be run through all of the room's edges, making the present system and method easier for a user to use and robust in an occluded environment. The existing applications require some time after their launch and need a manual/automatic calibration of AR sensors by rotation and device scanning against the plane ground or wall. The automatic calibration by plane detection becomes difficult or make take longer when the room's lighting condition is not proper or there is no difference in the colour of the wall and the ground. However, this is not a requirement in the present modelling system and modelling method. The user is only required to click/select images of the room, making it more robust in different lighting and interior environments.

Different light conditions and environments affect the quality of images and final results of layout generation. In existing methods, differently illuminated environments play a key role in the functioning of the method. In poor illumination, different applications discussed in the previous section are not able to extract visual features. The existing applications require scanning of the entire scene with a camera and require high contrast edges and curved surfaces to detect feature points. If the captured images do not have enough feature points, then different key points and features are not detected. In poorly illuminated images, there is a lack of contrast between two portions of a scene. Due to inconsistent indoor lighting, existing applications often are not able to capture feature points and do not start functioning. In contrast, the present modelling system and method does not require illumination or high contrast surfaces in the captured images.

Figure 20C:
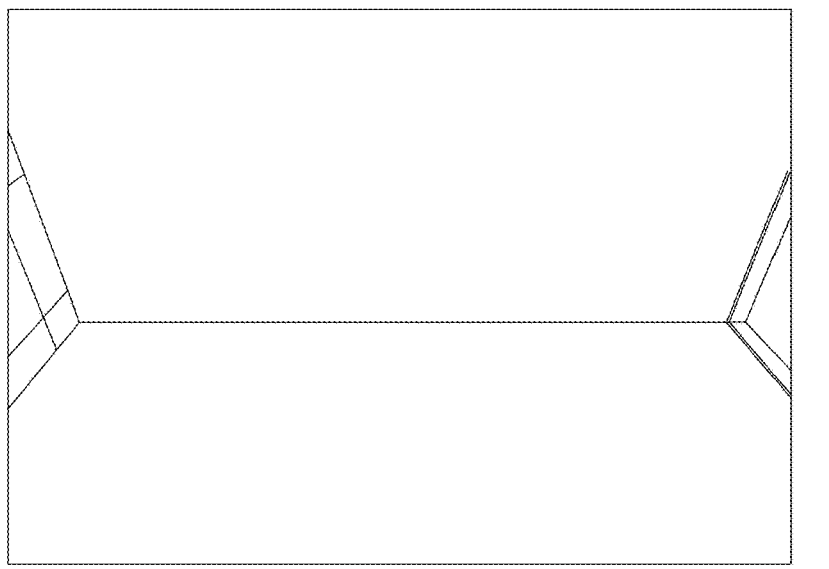
FIGS. 20A, 20B, 20C are illustrations of applications during scenes capture in low light environments.
Figure 20B:
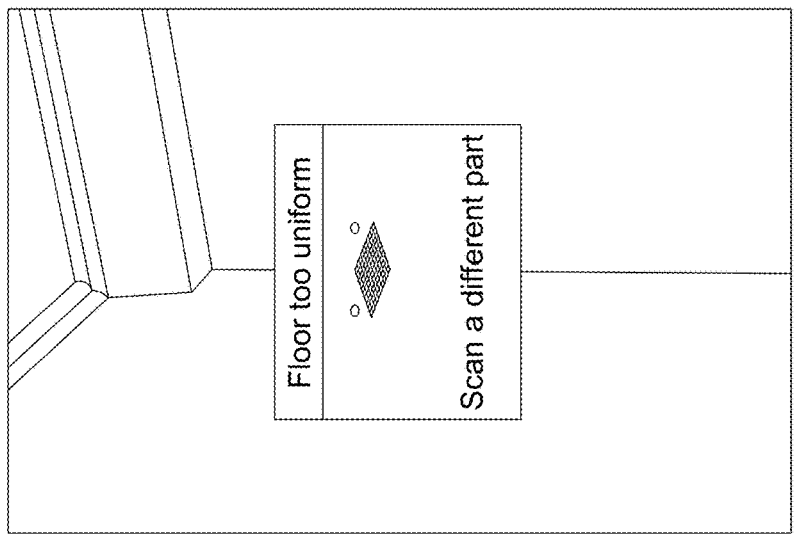
Figure 20A:
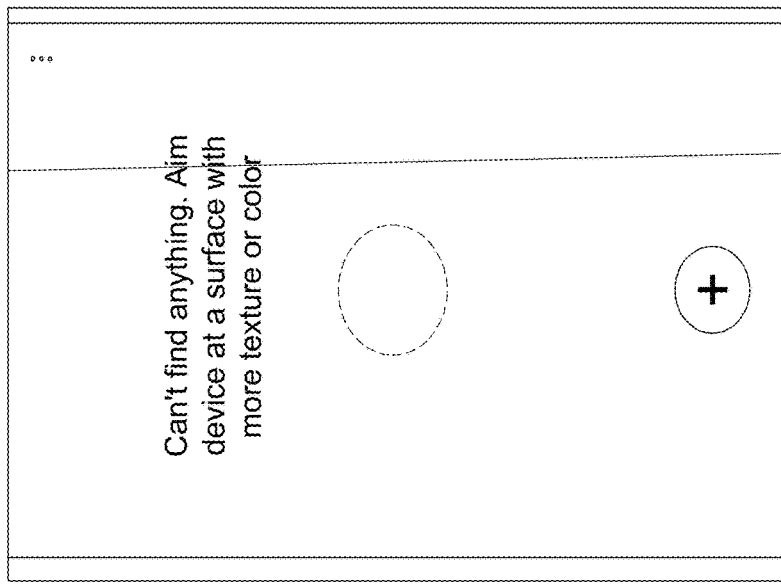

FIGS. 20A, 20B, and 20C are illustrations of various scenes taken with mobile applications using different applications in low light environments. FIG. 20A was taken with Google Measure, under low illumination, in a smooth surface, which could not be scanned because key points could not be detected. FIG. 20B was taken with the Magic Plan application in low light and consistent surface, which could not be scanned for the same reason. However, FIG. 20C is a part of a dataset collected using the present modelling system and method, which was taken in low illumination and has a consistent surface of smooth walls. The image in FIG. 20C was successfully contributed as part pf the generation of the final layout using the present system and method.

Figure 21:
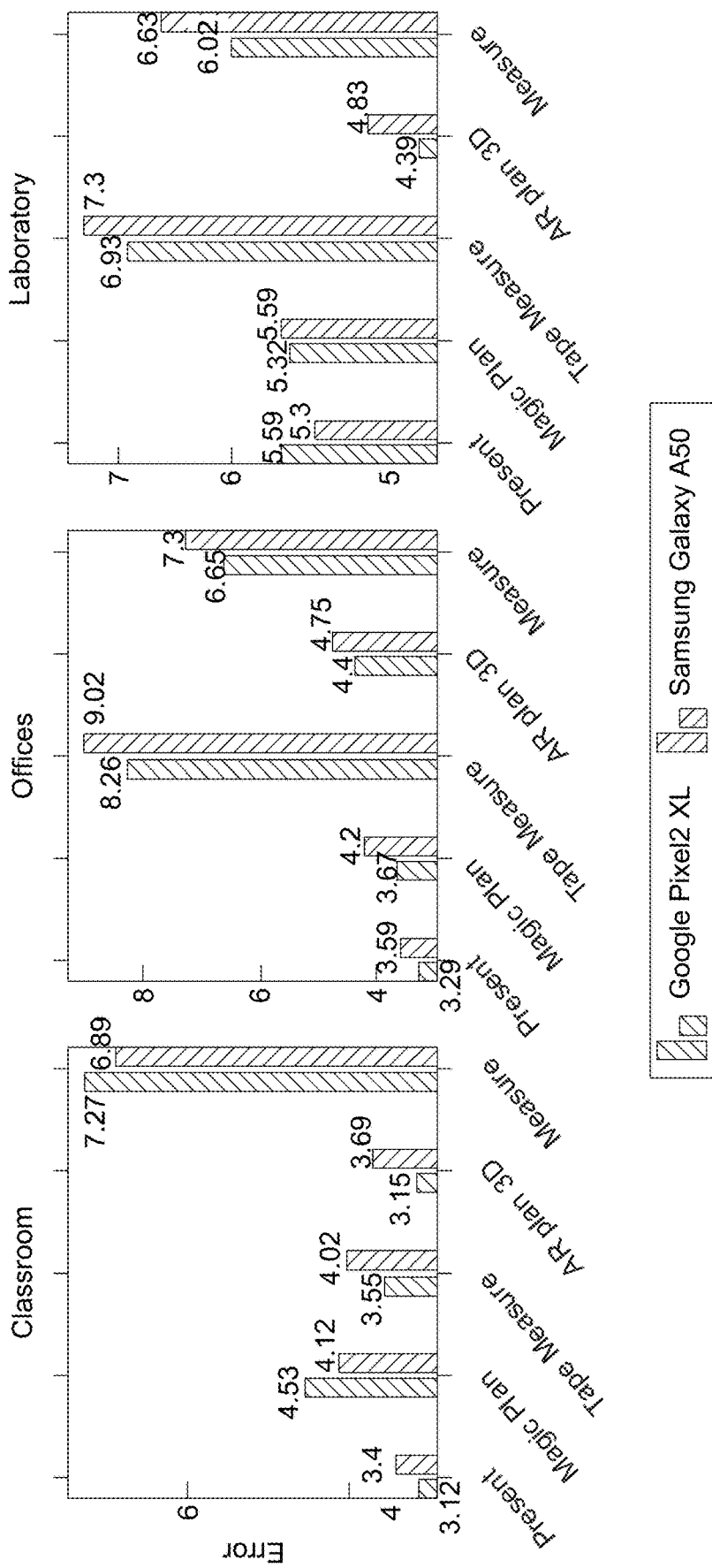
FIG. 21 are bar graphs showing comparative analysis of area error across different devices.
Figure 22:
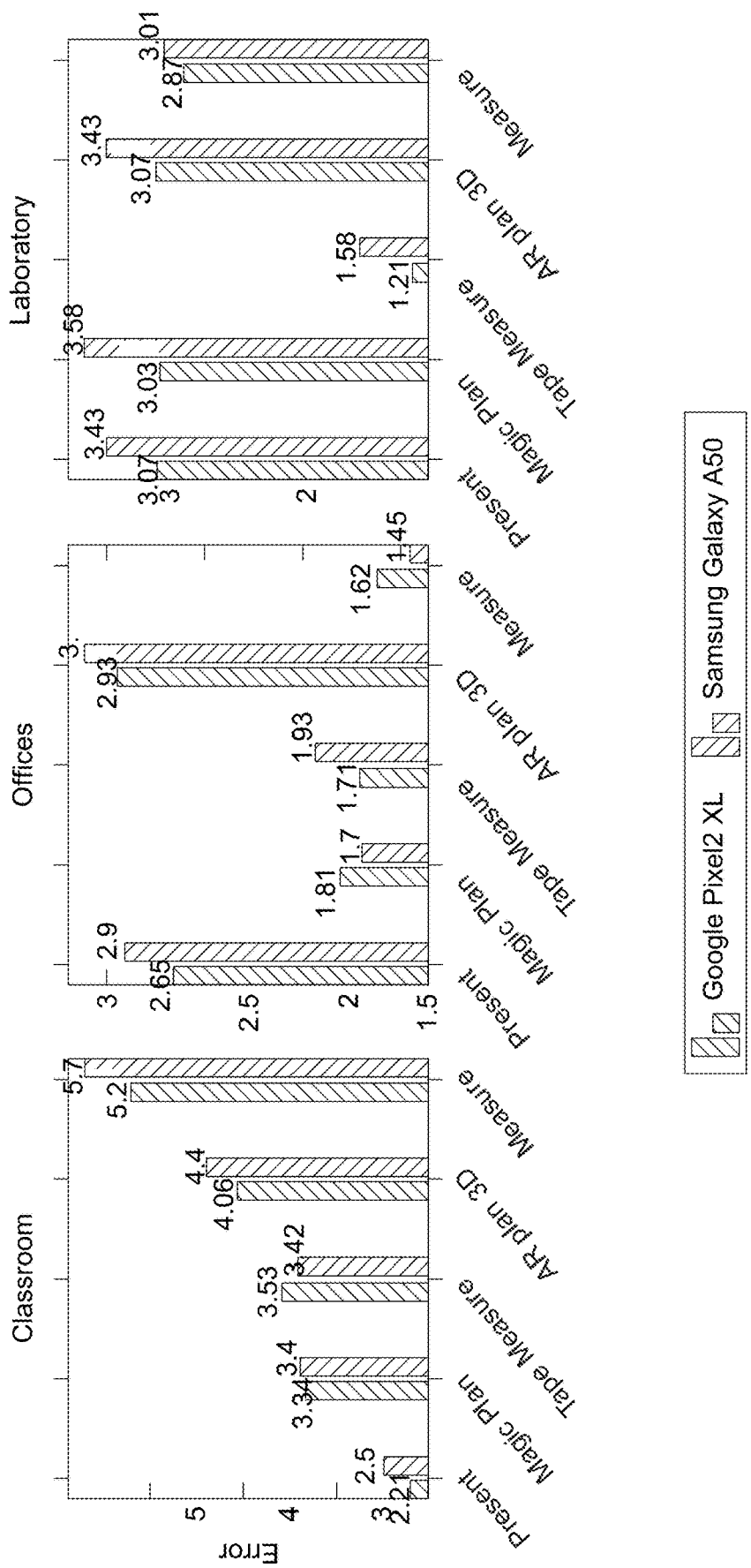
FIG. 22 are bar graphs showing comparison of aspect ratio error across different devices.
Figure 23:
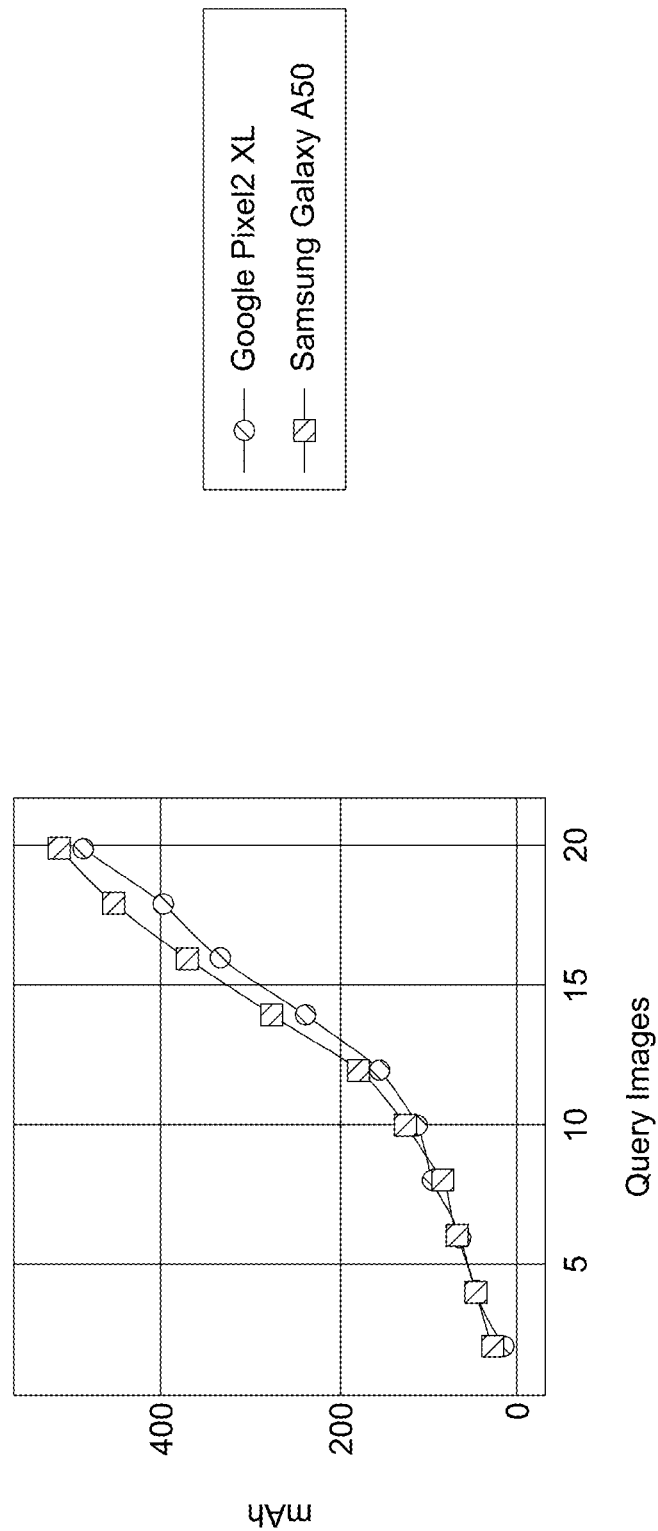
FIG. 23 is a graph comparing power consumption across devices.

FIGS. 21 and 22 show the mean absolute error comparative analysis for area and aspect ratio across the two devices used. These plots infer the robustness and platform independence of the present modelling system and method. The relative performance of the present modelling system and method is similar for both devices in terms of area error and aspect ratio error. FIG. 23 shows the comparative analysis of power consumption in mAh with a growing number of query images across devices. It can be seen that Samsung Galaxy A50 is consuming more power for the proposed system and is less efficient than Google Pixel 2 XL. Energy consumption is measured in terms of the battery used on each mobile device, which was recorded manually, from the start of data collection, with each query image collected.

Overall, the present modelling system and method can generate a reasonably accurate layout in terms of the error in area, aspect ratio while requiring far less user interaction and intervention than existing applications.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the example embodiments may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of example embodiments may be implemented in the form of a software product. The software product is stored in a storage medium, and includes several instructions for instructing a computer device (which may be a personal computer, a server, or a network device) to perform all or some of the steps of the methods described in the example embodiments. The foregoing storage medium includes any medium that can store program code, such as a Universal Serial Bus (USB) flash drive, a removable hard disk, a read-only memory (ROM), a random access memory (RAM), a magnetic disk, or an optical disc. In an example, the software product can be an inference model generated from a machine learning training process.

In the described methods or block diagrams, the boxes may represent events, steps, functions, processes, modules, messages, and/or state-based operations, etc. While some of the example embodiments have been described as occurring in a particular order, some of the steps or processes may be performed in a different order provided that the result of the changed order of any given step will not prevent or impair the occurrence of subsequent steps. Furthermore, some of the messages or steps described may be removed or combined in other embodiments, and some of the messages or steps described herein may be separated into a number of sub-messages or sub-steps in other embodiments. Even further, some or all of the steps may be repeated, as necessary. Elements described as methods or steps similarly apply to systems or subcomponents, and vice-versa. Reference to such words as "sending" or "receiving" could be interchanged depending on the perspective of the particular device.

The described embodiments are considered to be illustrative and not restrictive. Example embodiments described as methods would similarly apply to systems or devices, and vice-versa.

The various example embodiments are merely examples and are in no way meant to limit the scope of the example embodiments. Variations of the innovations described herein will be apparent to persons of ordinary skill in the art, such variations being within the intended scope of the example embodiments. In particular, features from one or more of the example embodiments may be selected to create alternative embodiments comprised of a sub-combination of features which may not be explicitly described. In addition, features from one or more of the described example embodiments may be selected and combined to create alternative example embodiments composed of a combination of features which may not be explicitly described. Features suitable for such combinations and sub-combinations would be readily apparent to persons skilled in the art. The subject matter described herein intends to cover all suitable changes in technology.

What is claimed is:

1. A modelling method comprising:
receiving two-dimensional (2D) images of corners of an interior space captured by a camera;
generating, using a positioning module, a corresponding camera position and camera orientation in a three-dimensional (3D) coordinate system in the interior space for each 2D image;
generating a corresponding depth map for each 2D image by using a depth module to estimate depth for each pixel in each 2D image;
generating a corresponding edge map for each 2D image by using an edge module to identify whether each pixel in each 2D image is a wall or an edge;
generating, using a reconstruction module, a 3D point cloud for each 2D image using the corresponding depth map and a focal length and center coordinates of the camera;
transforming, using a transformation module, the 3D point clouds with the corresponding edge map into a 2D space in the 3D coordinate system from a perspective of the camera;
regularizing, using a regularization module, the 3D point clouds in the 2D space into boundary lines; and
generating a 2D plan of the interior space from the boundary lines;
wherein coordinates for each pixel in each 3D point cloud is generated by:

$$Z = \frac{D_{u,v}}{S};$$
$$X = \frac{(u - C_x)}{f} * Z;$$
$$Y = \frac{(v - C_y)}{f} * Z;$$

wherein X, Y are coordinates corresponding to a real world,
Z is a depth coordinate,
$D_{u,v}$ is a depth value corresponding to the (u,v) pixel in the depth map,
S is a scaling factor of each corresponding 2D image,
f is the focal length of the camera, and
$C_x$, $C_y$ are the center coordinates of the camera.

2. The modelling method of claim 1, wherein the transforming comprises:
mapping each 3D point cloud with the corresponding edge map to identify boundary pixels and projecting them in the 2D space to generate a partial point cloud for each 3D point cloud; and
assembling the partial point clouds in the 3D coordinate system from the perspective of the camera using the corresponding camera positions and camera orientations.

3. The modelling method of claim 2, wherein the regularizing comprises:
translating each partial point cloud into boundary corner lines using a clustering algorithm; and
adjusting the boundary corner lines to be perpendicular boundary lines.

4. The modelling method of claim 3, wherein the regularizing further comprises:
forming a polygon with the boundary lines; and
adjusting the boundary lines such that adjacent lines are collinear.

5. The modelling method of claim 1, wherein the 2D images are RGB monocular images.

6. The modelling method of claim 1, wherein the 2D images are 2D images of each corner of the interior space, each 2D image corresponding with one corner of the interior space.

7. The modelling method of claim 1, wherein the positioning module comprises ARCore for generating the camera position and camera orientation for each 2D image.

8. The modelling method of claim 1, wherein the depth map for each 2D image is generated by an encoder-decoder architecture that extracts image features with a pre-trained DenseNet-169.

9. The modelling method of claim 1, wherein the edge map for each 2D image is generated by an encoder-decoder architecture that estimates layout with LayoutNet network.

10. The modelling method of claim 1, wherein the edge map for each 2D image is generated presuming a Manhattan world.

11. The modelling method of claim 1, further comprising identifying the focal length and center coordinates of the camera prior to generating the 3D point cloud for each 2D image.

12. The modelling method of claim 1, further comprising:
detecting, using an object detecting module, a presence of a door and a door position of the door in one or more of the 2D images; and
generating a door symbol in the door position in the 2D plan of the interior space.

13. The modelling method of claim 12, wherein the generating the door symbol in the door position is carried out using the following equations:

$$\text{Ratio}_D = \frac{dist(C_{BBI}, W_I)}{L_{WI}};$$
$$dist(C_{BBF}, W_{IF}) = L_{WF} * \text{Ratio}_D;$$

wherein $C_{BBI}$ is a centroid of a bounding box of the door in the corresponding 2D image,
$dist(C_{BBI}, W_I)$ is a distance between $C_{BBI}$ and $W_I$ (wall),
$L_{WI}$ is a distance between two corners of the walls in the corresponding 2D image,
$\text{Ratio}_D$ is the ratio between $dist(C_{BBI}, W_I)$ and $L_{WI}$,
$L_{WF}$ is a distance between the two corners of the walls in the 2D plan of the interior space,
$dist(C_{BBF}, W_{IF})$ is a distance between a centroid of the door symbol ($C_{BBF}$) and the wall ($W_{IF}$) in the 2D plan of the interior space.

14. The modelling method of claim 1,
wherein the interior space is a floor with multiple rooms;
wherein the generating of the boundary lines are for the multiple rooms;
wherein the generating of the 2D plan includes generating respective 2D plans of the multiple rooms and arranging the respective 2D plans on the floor.

15. The modelling method of claim 14, further comprising generating an outer boundary by finding a convex hull for all of the multiple 2D plans.

16. The modelling method of claim 15, further comprising aligning all of the multiple 2D plans with the generated outer boundary.

17. The modelling method of claim 1, wherein the method is performed by at least one processor.

18. The modelling method of claim 1, further comprising outputting the 2D plan on a display or on another device.

19. A modelling system comprising:
at least one processor; and
memory containing instructions which, when executed by the at least one processor, causes the at least one processor to:
receive two-dimensional (2D) images of corners of an interior space captured by a camera;
generate, using a positioning module, a corresponding camera position and camera orientation in a three-dimensional (3D) coordinate system in the interior space for each 2D image;
generate a corresponding depth map for each 2D image by using a depth module to estimate depth for each pixel in each 2D image;
generate a corresponding edge map for each 2D image by using an edge module to identify whether each pixel in each 2D image is a wall or an edge;
generate, using a reconstruction module, a 3D point cloud for each 2D image using the corresponding depth map and a focal length and center coordinates of the camera;
transform, using a transformation module, the 3D point clouds with the corresponding edge map into a 2D space in the 3D coordinate system from a perspective of the camera;
regularize, using a regularization module, the 3D point clouds in the 2D space into boundary lines; and
generate a 2D plan of the interior space from the boundary lines,
wherein coordinates for each pixel in each 3D point cloud is generated by:

$$Z = \frac{D_{u,v}}{S};$$

$$X = \frac{(u - C_x)}{f} * Z;$$

$$Y = \frac{(v - C_y)}{f} * Z;$$

wherein X, Y are coordinates corresponding to a real world,
Z is a depth coordinate,
$D_{u,v}$ is a depth value corresponding to the (u,v) pixel in the depth map,
S is a scaling factor of each corresponding 2D image,
f is the focal length of the camera, and
$C_x$, $C_y$ are the center coordinates of the camera.

20. The modelling system of claim 19, further comprising a camera configured to capture the 2D images of the interior space.

21. The modelling system of claim 20, wherein the camera is a monocular, RGB camera.

22. The modelling system of claim 20, further comprising a local processor coupled to the camera; and
a local memory containing instructions which, when executed by the local processor, cause the local processor to generate the camera position and camera orientation for each 2D image captured.

23. The modelling system of claim 20, wherein the camera, the at least one processor, and the memory are part of a smart phone.

24. The modelling system of claim 19, further comprising a display for displaying the 2D plan.

25. A non-transitory memory containing instructions which, when executed by at least one processor, cause the at least one processor to:
receive two-dimensional (2D) images of corners of an interior space captured by a camera;
generate, using a positioning module, a corresponding camera position and camera orientation in a three-dimensional (3D) coordinate system in the interior space for each 2D image;
generate a corresponding depth map for each 2D image by using a depth module to estimate depth for each pixel in each 2D image;
generate a corresponding edge map for each 2D image by using an edge module to identify whether each pixel in each 2D image is a wall or an edge;
generate, using a reconstruction module, a 3D point cloud for each 2D image using the corresponding depth map and a focal length and center coordinates of the camera;
transform, using a transformation module, the 3D point clouds with the corresponding edge map into a 2D space in the 3D coordinate system from a perspective of the camera;
regularize, using a regularization module, the 3D point clouds in the 2D space into boundary lines; and
generate a 2D plan of the interior space from the boundary lines,
wherein coordinates for each pixel in each 3D point cloud is generated by:

$$Z = \frac{D_{u,v}}{S};$$

$$X = \frac{(u - C_x)}{f} * Z;$$

$$Y = \frac{(v - C_y)}{f} * Z;$$

wherein X, Y are coordinates corresponding to a real world,
Z is a depth coordinate,
$D_{u,v}$ is a depth value corresponding to the (u,v) pixel in the depth map,
S is a scaling factor of each corresponding 2D image,
f is the focal length of the camera, and
$C_x$, $C_y$ are the center coordinates of the camera.

26. A modelling method comprising:
receiving two-dimensional (2D) images of corners of an interior space captured by a camera;
generating, using a positioning module, a corresponding camera position and camera orientation in a three-dimensional (3D) coordinate system in the interior space for each 2D image;
generating a corresponding depth map for each 2D image by using a depth module to estimate depth for each pixel in each 2D image;
generating a corresponding edge map for each 2D image by using an edge module to identify whether each pixel in each 2D image is a wall or an edge;
generating, using a reconstruction module, a 3D point cloud for each 2D image using the corresponding depth map and a focal length and center coordinates of the camera;
transforming, using a transformation module, the 3D point clouds with the corresponding edge map into a 2D space in the 3D coordinate system from a perspective of the camera;
regularizing, using a regularization module, the 3D point clouds in the 2D space into boundary lines;

generating a 2D plan of the interior space from the boundary lines;
detecting, using an object detecting module, a presence of a door and a door position of the door in one or more of the 2D images; and
generating a door symbol in the door position in the 2D plan of the interior space using the following equations:

$$\text{Ratio}_D = \frac{dist(C_{BBI}, W_I)}{L_{WI}};$$

$$dist(C_{BBF}, W_{IF}) = L_{WF} * \text{Ratio}_D;$$

wherein $C_{BBI}$ is a centroid of a bounding box of the door in the corresponding 2D image,
$dist(C_{BBI}, W_I)$ is a distance between $C_{BBI}$ and $W_I$ (wall),
$L_{WI}$ is a distance between two corners of the walls in the corresponding 2D image,
$\text{Ratio}_D$ is the ratio between $dist(C_{BBI}, W_I)$ and $L_{WI}$,
$L_{WF}$ is a distance between the two corners of the walls in the 2D plan of the interior space,
$dist(C_{BBF}, W_{IF})$ is a distance between a centroid of the door symbol ($C_{BBF}$) and the wall ($W_{IF}$) in the 2D plan of the interior space.

27. A modelling system comprising:
at least one processor; and
memory containing instructions which, when executed by the at least one processor, causes the at least one processor to:
receive two-dimensional (2D) images of corners of an interior space captured by a camera;
generate, using a positioning module, a corresponding camera position and camera orientation in a three-dimensional (3D) coordinate system in the interior space for each 2D image;
generate a corresponding depth map for each 2D image by using a depth module to estimate depth for each pixel in each 2D image;
generate a corresponding edge map for each 2D image by using an edge module to identify whether each pixel in each 2D image is a wall or an edge;
generate, using a reconstruction module, a 3D point cloud for each 2D image using the corresponding depth map and a focal length and center coordinates of the camera;
transform, using a transformation module, the 3D point clouds with the corresponding edge map into a 2D space in the 3D coordinate system from a perspective of the camera;
regularize, using a regularization module, the 3D point clouds in the 2D space into boundary lines;
generate a 2D plan of the interior space from the boundary lines detecting, using an object detecting module, a presence of a door and a door position of the door in one or more of the 2D images; and
generate a door symbol in the door position in the 2D plan of the interior space using the following equations:

$$\text{Ratio}_D = \frac{dist(C_{BBI}, W_I)}{L_{WI}};$$

$$dist(C_{BBF}, W_{IF}) = L_{WF} * \text{Ratio}_D;$$

wherein $C_{BBI}$ is a centroid of a bounding box of the door in the corresponding 2D image,
$dist(C_{BBI}, W_I)$ is a distance between $C_{BBI}$ and $W_I$ (wall),
$L_{WI}$ is a distance between two corners of the walls in the corresponding 2D image,
$\text{Ratio}_D$ is the ratio between $dist(C_{BBI}, W_I)$ and $L_{WI}$,
$L_{WF}$ is a distance between the two corners of the walls in the 2D plan of the interior space,
$dist(C_{BBF}, W_{IF})$ is a distance between a centroid of the door symbol ($C_{BBF}$) and the wall ($W_{IF}$) in the 2D plan of the interior space.

28. A non-transitory memory containing instructions which, when executed by at least one processor, cause the at least one processor to:
receive two-dimensional (2D) images of corners of an interior space captured by a camera;
generate, using a positioning module, a corresponding camera position and camera orientation in a three-dimensional (3D) coordinate system in the interior space for each 2D image;
generate a corresponding depth map for each 2D image by using a depth module to estimate depth for each pixel in each 2D image;
generate a corresponding edge map for each 2D image by using an edge module to identify whether each pixel in each 2D image is a wall or an edge;
generate, using a reconstruction module, a 3D point cloud for each 2D image using the corresponding depth map and a focal length and center coordinates of the camera;
transform, using a transformation module, the 3D point clouds with the corresponding edge map into a 2D space in the 3D coordinate system from a perspective of the camera;
regularize, using a regularization module, the 3D point clouds in the 2D space into boundary lines;
generate a 2D plan of the interior space from the boundary lines;
detect, using an object detecting module, a presence of a door and a door position of the door in one or more of the 2D images; and
generate a door symbol in the door position in the 2D plan of the interior space using the following equations:

$$\text{Ratio}_D = \frac{dist(C_{BBI}, W_I)}{L_{WI}};$$

$$dist(C_{BBF}, W_{IF}) = L_{WF} * \text{Ratio}_D;$$

wherein $C_{BBI}$ is a centroid of a bounding box of the door in the corresponding 2D image,
$dist(C_{BBI}, W_I)$ is a distance between $C_{BBI}$ and $W_I$ (wall),
$L_{WI}$ is a distance between two corners of the walls in the corresponding 2D image,
$\text{Ratio}_D$ is the ratio between $dist(C_{BBI}, W_I)$ and $L_{WI}$,
$L_{WF}$ is a distance between the two corners of the walls in the 2D plan of the interior space,
$dist(C_{BBF}, W_{IF})$ is a distance between a centroid of the door symbol ($C_{BBF}$) and the wall ($W_{IF}$) in the 2D plan of the interior space.

* * * * *